(12) United States Patent
Cockx et al.

(10) Patent No.: US 6,952,825 B1
(45) Date of Patent: Oct. 4, 2005

(54) CONCURRENT TIMED DIGITAL SYSTEM DESIGN METHOD AND ENVIRONMENT

(75) Inventors: Johan Cockx, Pellenberg (BE); Diederik Verkest, Kapellen (BE)

(73) Assignee: Interuniversitaire Micro-Elektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/484,117

(22) Filed: Jan. 14, 2000

Related U.S. Application Data
(60) Provisional application No. 60/138,644, filed on Jun. 10, 1999.

(30) Foreign Application Priority Data

Jan. 14, 1999 (EP) .............................................. 99200105

(51) Int. Cl.$^7$ ................................................. G06F 9/46
(52) U.S. Cl. ...................... 718/102; 718/100; 718/104; 717/104; 717/124; 717/135
(58) Field of Search ............................. 709/1–100, 102, 709/104, 107–108, 103, 109; 717/104, 110, 111, 114, 116, 118, 119, 124, 135; 707/206; 713/400–601

(56) References Cited

U.S. PATENT DOCUMENTS 5,361,362 A  *  11/1994  Benkeser et al. ........... 709/102

FOREIGN PATENT DOCUMENTS

EP          001065611 A2 * 10/1996    ........... G06F/17/50

OTHER PUBLICATIONS

Walsh, Aaron and Fronckowiak, John. Java Bible. Foster City, CA: IDG Books Worldwide, 1998.*

(Continued)

*Primary Examiner*—Meng-Al T. An
*Assistant Examiner*—Syed Ali
(74) *Attorney, Agent, or Firm*—Knobbe, Martens, Olson & Bear, LLP

(57) ABSTRACT

The present invention relates to the design of an essentially digital system. As one example of digital systems, these may perform real-time transformations on time discrete digitized samples of analogue quantities. An example of such a system is a digital communication system. The transformations on the data can be specified in a programming language and executed on a processor such as a programmable processor or directly on application specific hardware. In accordance with the present invention the digital system is described as a set of threads in a description language. Alternative names for a thread are tasks and processes. The set of threads defines a representation or model of the digital system. In accordance with the present invention, the representation or model is preferably executable at each stage of the design independent of the current level of abstraction of that representation or model. With description language is meant a programming language. In accordance with the present invention each of the threads has a variable having an assignable value which represents the "local time" of said thread, i.e. a time associated only with that thread, which can be used for sequencing the processing of that thread with respect to other threads. With the word "local" is meant that the time is an attribute of the thread only. In accordance with the present invention a means is provided for the designer to assign a delay to each thread or operation within a thread, this delay representing for instance the processing time for the respective operation or thread on a processing engine, e.g. a computer. By this means, not only can the processing of threads be scheduled but also the designer may assign a value representative of an elapsed time for the processing of a thread or operation on a processing engine. In addition, the threads may be refined concurrently, while still keeping their local time so that after the refining process the new representation of the digital system is executable, i.e. the processing of the refined threads can be scheduled without divergence from the specification.

35 Claims, 10 Drawing Sheets

U.S. PATENT DOCUMENTS

| | | | | |
|---|---|---|---|---|
| 5,493,508 | A | * | 2/1996 | Dangelo et al. ............... 716/5 |
| 6,438,573 | B1 | * | 8/2002 | Nilsen ....................... 709/100 |
| 5,726,902 | A | * | 3/1998 | Mahmood et al. ............ 716/6 |
| 5,867,691 | A | * | 2/1999 | Shiraishi .................... 713/400 |
| 5,870,588 | A | * | 2/1999 | Rompaey et al. ............ 703/13 |
| 5,999,963 | A | * | 12/1999 | Bruno et al. ............... 709/104 |
| 6,088,734 | A | * | 7/2000 | Marin et al. ................ 709/232 |
| 6,233,540 | B1 | * | 5/2001 | Schaumont et al. .......... 703/14 |
| 6,292,916 | B1 | * | 9/2001 | Abramovici et al. ........ 714/736 |
| 6,374,286 | B1 | * | 4/2002 | Gee et al. ................... 709/108 |
| 6,401,240 | B1 | * | 6/2002 | Summers .................... 717/130 |

OTHER PUBLICATIONS

Hein, et al., *RASSP VHDL Modeling Terminology and Taxonomy*, RASSP Taxonomy Working Group (RTWG) Rev. 2.3, Jun. 23, 1997.

Kain, et al., *The Semantics of a Simple Language for Parallel Programming*, Information Processing 74—North--Holland Publishing Company (1974), pp. 471–475.

Liao, et al., *An Efficient Implementation of Reactivity for Modeling Hardware in the Scenic Design Environment*, Dept. of Information and Computer Science, UC Irvine, (1997), pp. 70–74.

Little, et al., *Construction and Use of a Simulation Package in C++*, Abstract Department of Computer Science, University of Newcastle upon Tyne, Newcastle upon Tyne, NEI 7RU, UK, Xerox Corp., Webster, NY 14580, 1998.

Young, et al, *Design and Specification of Embedded Systems in Java Using Successive, Formal Refinement*, Department of Electrical Engineering and Computer Sciences, University of California, Berkley, (1998), pp. 70–75.

Olson, et al., *Systems Engineering Using SDL–92*, Elsevier Science B.V., First Ed. 1994, Second Impression 1995, Third Impression 1996, Library of Congress Cataloging–in–Publication Data.

SDL Class Training Course *Specification and Description Language (SDL)*, Bell Education Centre, Ed.: 01.

* cited by examiner

```
void thread1();

void thread2();

main()
{
    ...

spawn(&thread1);
    spawn(&thread2);

...

run();
}
```

```
class MyBlock { int _private_thread_data;

...

void body() { ... }
public:

MyBlock() {spawn(this,&body); } int externalAccessFunction() {return _private_thread_data; }

```
template<class T> class Shared {

T _value;
public:

Shared(T value):_value(value) {} operator T() const { sync(); return _value; }

T operator=(T value) { sync(); return _value = value; }

T operator+=(T value) { sync(); return _value += value; }

T operator++() {sync(); return ++_value;}

...etc for all C++ operators that can change a value ...
};
```

FIG. 4

Mutex m;

void f()

{

Lock l(m);

...

}

FIG. 5 class Mutex { public:

Mutex();

~Mutex();

bool locked() const;

};

class Lock { public:

Lock(Mutex& mutex);

~Lock();

};

class Signal { public:

Signal ();

~Signal();

void wait();

void emit();

```
class Thread {
public:
  Thread();
  virtual~Thread();
  static Thread*current();
  static void setCurrent( Thread* thread );
  static void setNext( Thread* next );
  // Set the thread to execute after the next call of the destructor;
  // needed to allow destruction of the current thread.
virtual void body();
  // Function executed by this thread.
};
```

FIG. 7

```
class TimeThread: public Thread {
public:
  TimeThread();
  ~TimeThread();
  virtual void body();
  static TimeThread* current();
  typedef double Time;
  static Time now();
  static void delay ( Time period );
  static void sync();
  static void suspend();
  void resume();
};
```

*FIG. 8*

| | Application<br>e.g. ATMP model | | | |
|---|---|---|---|---|
| "ease-of-use"<br>spawn(...), now(),<br>delay(p), sync(),<br>suspend(), resume (t) | Shared <T><br>automatic sync()<br>for shared data | Mutex/Lock<br>based on<br>suspend() and<br>resume() | Signal<br>based on<br>suspend() and<br>resume() | Etc.<br>comm. prim.'s,<br>RTOS models,<br>..... |

| TimeThread | now(), delay(period), sync(), suspend(), resume(thread) |
|---|---|
| Thread | non-preemptive multithreading current(), setCurrent() |
| UNIX | setjmp(), longjmp(), stack creation/manipulation |

*FIG. 9*

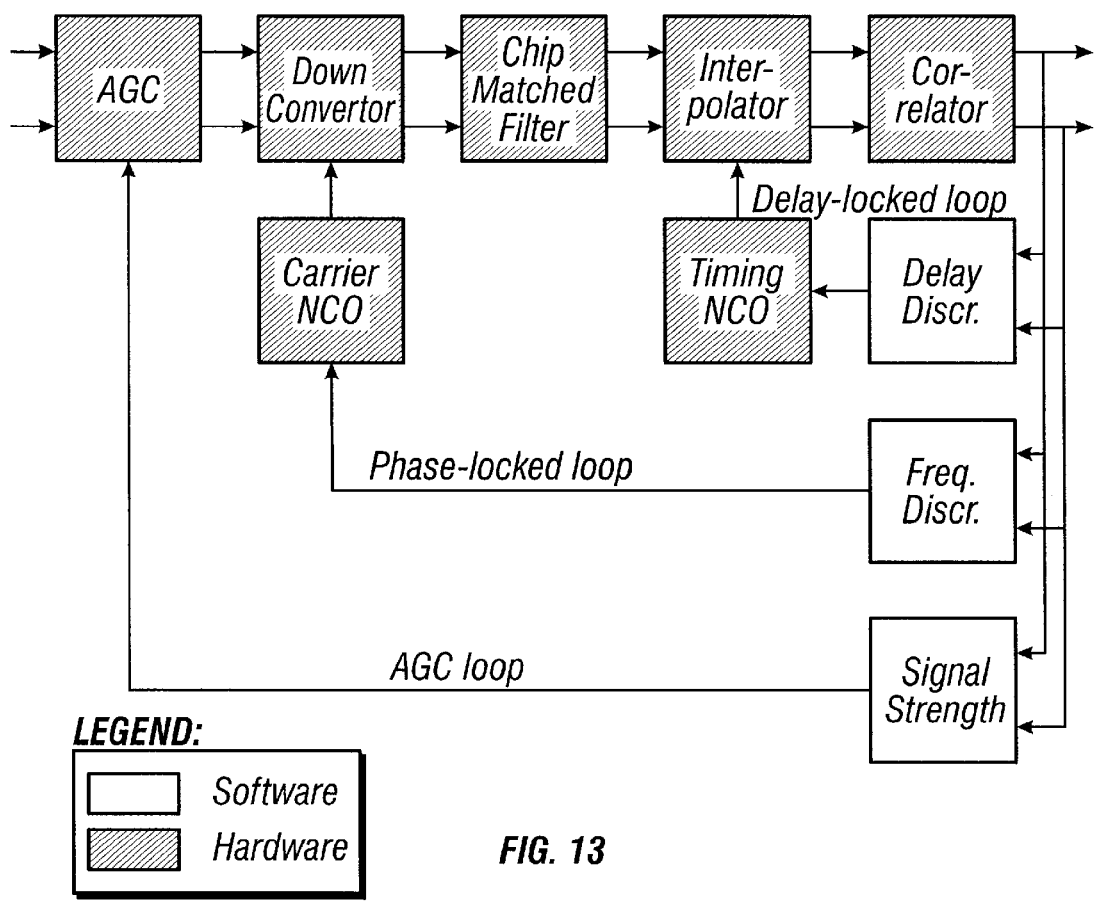
FIG. 13
| task name | period (μs) | execution (cycles) | time (μs) |
|---|---|---|---|
| PLL | 15.6 | 234 | 5.85 |
| DLL | 500 | 248 | 6.2 |
| AGC | 15.6 | 107 | 2.67 |
| CTL | $10^5$ | --- | $10^4$ |
FIG. 14
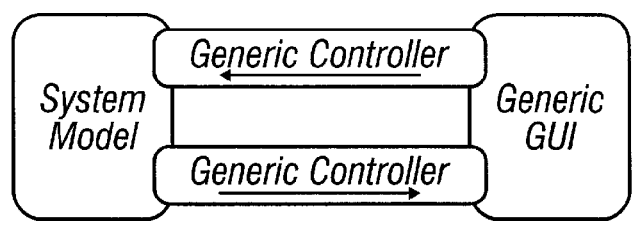
FIG. 15

CONCURRENT TIMED DIGITAL SYSTEM DESIGN METHOD AND ENVIRONMENT

RELATED APPLICATIONS

This application claims priority to the following U.S. patent application which was filed on Jun. 10, 1999, U.S. Application No. 60/138,644, and also European Patent No. EP 99/200 1057 filed on Jan. 14, 1999.

FIELD OF THE INVENTION

The present invention relates to design methodologies and design environments for essentially digital systems. The present invention includes executable system modelling.

BACKGROUND OF THE INVENTION

Design methodologies for essentially digital systems often deal with a particular abstraction level (RASSP *Taxonomy Working Group, RASSP VHDL Modeling Terminology and Taxonomy*, revision 2.3, Jun. 23, 1998 http://www.atl.external.lmco.com/rassp/taxon/rassp_taxon.html). The abstraction level of a system model is an indication of the degree of implementation detail contained within the model. Abstraction levels with increasing amount of detail form a hierarchy of abstraction levels. A design at a given abstraction level is described in terms of a set of constituent terms and their interrelationships or protocols, which in turn can be decomposed into their constituent parts at a lower level of abstraction, i.e. a higher level of refinement. Level of abstraction may be seen as the inverse or compliment of resolution, detail or granularity.

When dealing with essentially digital systems an abstraction may be described by its functional form. For instance, a system level model is a description in which a complex system is described as a composition of subsystems. Each of the subsystems may be described as a sequential process, whereby the processes may run concurrently and may use various communication mechanisms or protocols for interaction with other subsystems or systems.

An algorithmic level model describes how the system consumes input values supplied to its inputs in order to deliver the required answers to its outputs. Operations are grouped into algorithms.

A register-transfer level model describes a system in terms of registers, i.e. elemental storage for data, combinational circuitry, low-level buses and control circuits, usually implemented as finite state machines. A hardware model at the logic level describes a system in terms of equivalent Boolean logic functions and simple memory devices as flip-flops. A hardware model at the circuit level describes a system in terms of electronic components such as transistors, resistors, capacitors.

Besides abstraction levels for the description of a system there are also three further system aspects which are important. A first aspect of a system is its functionality. Another aspect of a system is its structure. This aspect describes how the system is mapped to a structure. With structure is meant an indication of how a system may be split into parts including describing a hierarchy between the parts and an indication of how these parts are interconnected. A third aspect of a system is its timing.

Also various ways of representing a system, also denoted computation models, are known. These computation models are often associated with a particular abstraction level although this is not necessary. In addition various modelling styles are known. A modelling style often comprises a computation model plus an interpretation of the computation model in terms of the implementation aspects and some application-domain specific support.

Two known computation models are situated at the algorithmic level. A data flow graph describes an algorithm in terms of its inherent data dependencies of its mathematical operations. A token based performance model, typically used for representing a multiprocessor, does not model data values except control information. This type of model is used to resolve timing aspects of a system.

A particular way of representing a system is to describe it as a set of interacting or communicating processes, also denoted tasks or threads. Each process thread comprises a set of operations, any operation possibly performing operations on a data structure which may be dedicated for that process or may be shared by a plurality of processes. Interaction or communication between processes may take place via accesses to data structures, shared by the processes. This way of representing a system as a multitude of threads is called a multi-threading approach.

An executable system model is a description of a system that can be executed or simulated on a processing engine, e.g. a computing system, at any time during the design of the system under consideration. When a system, represented as a multitude of threads, is to be executed or simulated, a thread selection scheme or scheduler determines the order in which threads are executed by interleaving and parallel execution of threads.

Multi-threading should not be confused with multi-tasking and multi-processing. With multi-tasking it is meant that the computer system (and its operating system) on which simulations takes place supports the simultaneous execution of multiple tasks. This can be through scheduling tasks by distributing the tasks over several processors. A multi-tasking supporting computer can be exploited for implementing a multi-threading approach. In principle, multi-threading does not need multi-tasking nor is multi-tasking limited to multi-threading applications. Multi-tasking can lead to reduced simulation times. Although other interpretations of multi-tasking and multi-threading are known, it can be said that within the context of the present invention, multi-tasking is related to implementation of the simulation while multi-threading is related to the conceptual representation of a system in a simulation model.

As a simplified summary, multi-threading refers to user-level parallelism, multi-tasking refers to operating-system-level parallelism and multi-processing refers to hardware-level parallelism. Multi-threading and multi-tasking are strongly related and are often used interchangeably; both providing a representation of parallelism to the user and may or may not take advantage of parallel hardware or multi-processing. Real parallel execution and a real speedup of the simulation requires hardware-level parallelism or multi-processing.

As designs are becoming more complex and because there is an on-going requirement for the design times to be reduced, digital system design conventionally starts by representing said digital system at high abstraction levels.

In a strict top-down sequential design flow an electronic system is first designed at a high, purely functional abstraction level. Only when the high-level functional design is completed is the design is continued at a lower abstraction level by adding structure and timing detail. One conventional approach is to traverse from the system-level to the algorithmic level, the register-transfer level, the logic level and finally the circuit-level.

Such a top-down design strategy does however not fully comply with a natural way of designing nor is it always possible to use such a strategy. During design designers would prefer to start refining part of the design to lower abstraction levels while leaving other parts of the design at higher levels of abstraction. Moreover designers typically prefer to introduce the different aspects of parts of their design simultaneously. As such designers would prefer a concurrent refinement procedure. Two types of concurrent refinement have been identified above. A first type is concurrent refinement of parts of the design. A second type is concurrent refinement of different aspects of parts of the design.

As one of the aspects of a design is its timing, it would be preferable to allow introduction of timing at high abstraction levels. High-level descriptions are often given in a natural language. Fast reliable design strategies require, however, executable models of the digital system under consideration so that the execution of the design can be checked at any stage. Ideally, simulation or execution of the models should be efficient, thus resulting in short simulation times in order to reduce the design time.

The timing aspect of a design can be incorporated when a multi-threading concept is used for representing a system. However, the timing concept used in conventional methodologies is not based on advanced thread selection schemes but for instance on a sequential processing of the threads, resulting in low simulation efficiency.

To summarise it can be concluded that there is a need for a design methodology and environment for essentially digital systems, enabling design initially at high-abstraction levels and supporting concurrent refinement of parts of said design as well as enabling introduction of different aspects of said design simultaneously. Different computation models and modelling styles should preferably be exploitable in the methodology. The design methodology and environment should enable incorporating timing, which is one of the aspects of a design, at all possible abstraction levels. The models used in such a methodology should preferably be executable, thus enabling simulation at any time during the design process. This allows extraction of characteristics of the design at any time during the design process. The design methodology and environment should preferably result in high simulation efficiency. providing a design methodology and design environment satisfying all the above stated requirements has proved to be difficult.

Available languages such as OMT, SDL, C++ (A. Olsen et al, *Systems Engineering Using SDL*-92, ISBN 0-444-89872-7, Elsevier Science B. V.,1994, Bell Education Centre, SDL, Notes of SDL introductory course, 1997) do not support concurrent refinement of different aspects of the design in the design process adequately as it is difficult to incorporate aspects of structure and timing in models defined at a high abstraction level. C++ does not support timing. OMT models are not executable. Traditional system design methodologies, such as VHDL, which include timing are oriented only on the register-transfer level which is a low level abstraction. Behavioural VHDL incorporates timing but only supports a limited computation model, in particular signals and has a very low simulation efficiency. Known high-level object-oriented design methodologies do not include timing at all abstraction levels. Although in the environment and methodology described in EP 772 140 aspects of a digital system such as functionality, structure or architecture and timing, denoted there as communication or concurrency are defined, it is assumed in this known methodology that the functionality of the digital design is fully available. A methodology with refinement means mapping functionality to an architecture, taking into account communication and concurrency. Concurrent refinement of the three aspects of a digital system namely, functionality, timing and structure, is not supported in such an environment. In this known environment timing is done via communication and concurrency but is not supported at all abstraction levels.

Known multi-threading system models, even without real data-sharing, like SDL (Specification Description Language) are non-deterministic (resulting in long analysis time). The deterministic models, like Kahn process networks (G. Kahn, *The Semantics of a Simple Language for Parallel Programming*, Proc. of the IFIP Congress 74, North-Holland Publishing Co., 1974) which is a specific form of data flow process networks, only allow a very restricted interprocess communication and have no time concept.

In the article by D. B. Lidsky and J. M. Rabaey, "The conceptual-level design approach to complex systems", Journal of VLSI signal processing 18,11–24, 1998, Kluwer Academic Publishers, the Netherlands a design methodology is described which does not result in an executable model. In the presentation by J. S. Young, J. MacDonald, M. Shilman, A. Tabbara, P. Hilfinger and A. R. Newton, presented at DAC98, June 1998 timing is introduced at all abstraction levels but only for one particular (and thus only for a restricted) computation model. In the article by M. C. Little and D. L. McCue, "Construction and Use of a Simulation Package in C++", http://cxxsim.ncl.ac.uk/homepage.html a multi-threading simulation language is disclosed. The timing aspects, supported by the language are, however, not adapted to digital system design.

Simulation efficiency can be obtained by using multi-tasking when possible, for instance when a multi-processor computing environment can be exploited. Simulation efficiency can also be obtained by preventing context switching. Indeed when the scheduler decides to execute another thread the local data of thread has to be loaded, which takes some simulation time. This is called context switching. Efficient simulation requires a method whereby the context is only switched when necessary, for instance, due to interprocess communication. Context switching can be avoided by concurrent execution of threads, which is a third type of concurrency. Existing approaches for simulation efficiency optimisation are based on initially neglecting interprocess communication and then rolling back the simulation when it is discovered that interprocess communication has taken place. Such an approach is however limited to simulations with a very restricted time concept. Such an approach requires that all interprocess communication and the internal state of each process are made accessible to the scheduler, which is not always possible or desirable.

Simulation of design models should preferably be deterministic. The thread selection schemes should preferably result in a deterministic behaviour of the system, e.g., when the same stimuli or inputs are applied to the modelled system, the simulation should be performed in the same order (same selection of the threads) and thus result in the same output. Deterministic behaviour results in less analysis time when compared to non-deterministic systems.

In particular, the design models should include at least timing information to reduce non-determinism and the simulation of the design models should be reproducible: when the scheduler has a choice because the model is non-deterministic, it should always make the same choice.

SUMMARY OF THE INVENTION

The present invention includes a method for generating an implementation of an essentially digital system, comprising the steps of: defining a set of first process threads in a description language which provides a first representation of the specification of the digital system, each first process thread representing a process carried out by the digital system when executed on a processing engine, comprising the steps of:
1) Associating with each of the first process threads a variable whose value represents local timing for that thread when the thread is executed on a processing engine;
2) Concurrently creating second process threads being refinements of at least part of the first process threads and having more detail while remaining within the specification of the digital system, the second process threads defining a second representation of the digital system;
3) Assigning to each new second process thread a value for the local timing variable; and
4) Repeating steps 2 and 3 to produce second process threads of greater detail defining further representations of the digital system until the granularity of the representation of the digital system provided by the refined process threads is finer than a predetermined threshold.

The present invention also includes a design environment for generating an implementation of an essentially digital system, comprising: a first description of the digital system in a description language as a set of first process threads, each of the threads being associated with a variable whose value represents a local time of the thread when the thread is executed on a processing engine; means for concurrently generating second process threads from at least a part of the first process threads, the second threads having more detail while remaining within the specification of the digital system, the second process threads defining a second representation of the digital system; and means for associating a variable to each second process thread having a value representing the local time of that second thread. It also includes means for executing the first or second representation of the digital system, comprising: a scheduler for concurrently executing the threads, the scheduler selecting the next thread to be processed such that variables shared by different threads are accessed in order of increasing value for the local time variable of the threads.

The present invention includes initially designing at high abstraction levels followed by refinement to more detailed implementable models. The present invention includes a design methodology and environment for essentially digital systems. The design methodology and the design environment support concurrent refinement of parts of the design during the design process. The design methodology and the design environment support simultaneous or concurrent incorporation of three aspects of the design: functionality, timing and structure at all possible abstraction levels. The design method and the design environment includes an executable modelling approach. Simulation efficiency is improved by exploiting multi-tasking facilities when possible, avoiding context switching. Simulations in accordance with the present invention include timing information and thus reduce non-determinism. In the design method and the design environment according to the present invention a multitude of computation models and modelling styles can be exploited.

One embodiment of the invention provides a method and design environment based on executable models and efficient simulation for designing essentially digital systems.

Another embodiment of the invention provides a method and design environment which enable starting a design of an essentially digital system at high abstraction levels and which support concurrent refinement.

In the design methodology and the design environment according to the present invention a digital system is represented as a set of functions with each function having a variable indicating the time of that thread, also denoted its local time. The functions are further denoted as threads. Alternative names for threads are tasks or processes.

The design method and the design environment refines concurrently at least part of the threads until the design reaches a predetermined level of sufficient granularity, detail or resolution. With concurrent refinement is meant that the abstraction level used in the design of a thread is independent of the abstraction level used for the other threads at any stage of the design. Concurrent refinement also means that the three aspects, timing, structure and functionality of the design, and in particular of each part of the design, represented by a thread, can be considered simultaneously.

With said multi-threading representation in accordance with the present invention a general manner of designing is presented to the designer, although conceptually the designer can orient his/her design by using one or more computation models.

Any representation generated by the methodology according to the present invention is an executable system model, meaning that it can be simulated at any time during design.

The execution of the system models in accordance with the present invention is based on a multi-threading approach. A scheduler determines which thread is executed, or more in particular, how threads are interleaved or executed in parallel. A execution rule is defined such that deterministic simulations are obtained. In principle, execution of the threads, and thus the progression of their local times, happens independently as long as no inter-thread communication takes place. Such an approach enables concurrent execution, and prevents unnecessary context switching and improves simulation efficiency. The multi-threaded simulation can be supported by a multi-tasking approach when possible, in order to improve simulation speed.

The design methodology and the design environment according to the present invention is supported by a particular description language. The description language contains functions for operating on threads. These functions are at least functions creating and deleting threads, functions dealing with timing and a function for identification of a thread. Further functions enable threads to suspend themselves or to suspend other threads and to resume other threads. The description language can contain particular program structures enabling mutual exclusive access to resources and private thread data.

As known programming languages do not have sufficient features enabling executable system modelling, these languages need be extended with functions and program constructs to support the design methodology and the design environment according to the present invention. The design method is embedded in a design environment, incorporating these functions and program constructs.

The description language can be either a traditional programming language or an object-oriented programming language. Nevertheless, object-oriented languages are preferred as the threads can then be represented as objects while the functions operating on the threads are just methods of the objects. With method is meant here a function or procedure that can be used on an object, as defined in object-oriented terminology. Methods are also denoted as functions. The program constructs, mentioned above, are also objects. In object-oriented languages objects are defined by the set to which they belong. Such a set is called a class. In general the extensibility, for instance via operator overloading and generic templates, of the description language is important as this facilitates support for various computation models and modelling styles. Note that in the article by M. C. Little and D. L. McCue, "Construction and Use of a Simulation Package in C++", http://cxxsim.ncl.ac.uk/homepage.html a multi-threading simulation language is disclosed. This language does not have a separate 'sync' primitive. Instead, synchronisation occurs implicitly at every 'delay', thus leading to more context switches than necessary.

There are important differences between Real-Time Operating System (RTOS) concepts and the present invention. Both provide multi-threading and a number of inter-thread communication and synchronisation primitives, such as mutexes, shared data, and thread suspension and resumption. Time is important for both the method according to the present invention and for RTOS. The essential difference between the invention and an RTOS relates to the intended use and the information available when operating the system. An RTOS is intended to be part of a system implementation. It tries to schedule the different threads such that time constraints are met as well as possible in real time. An RTOS has no delay() nor sync() primitives as described below (nor does it require such operations). Any processing delay in an RTOS follows implicitly from the execution of operations on the available fixed hardware. The present invention however is intended for system modelling at a design stage before sufficient information is available to determine the elapsed time of an operation and, therefore, the present invention introduces and uses the definition of a local timing for each of the threads. Timing specifications (delay calls) in the invention are always met, but in simulated time. An RTOS tries to execute multiple threads on a single processor, with fixed hardware, whereas in the present invention execution of the threads is simulated on sufficient (but not yet existing) hardware to meet the specified fixed timing. One consequence is that thread priorities are usually very important in a RTOS, but are not supported in the invention. A further embodiment of the present invention includes a design model of a RTOS using the present invention, and to use this model as part of a complete system model to evaluate the design option of implementing some of the system functionality using real-time software. In the invention, such an RTOS model could be integrated as just another communication and synchronisation mechanism, next to mutexes and other simpler mechanisms.

BRIEF DESCRIPTION OF THE DRAWINGS

FIG. 3 shows a definition of a class enabling data to be private to a thread.

FIG. 4 shows a definition of a class enabling automatic sync calls for shared data.

FIG. 5 shows an example of locking a thread f.

FIG. 6 shows a definition of classes enabling mutually exclusive access to resources.

FIG. 7 shows a definition of class thread.

FIG. 8 shows a definition of class "Timethread".

FIG. 9 shows a layered architecture of a description language.

FIG. 13 shows the forward path of the example satellite receiver is implemented in hardware, and the three feedback loops are closed in software.

FIG. 14 shows the periods and execution times of the software tasks of the example design. Execution times in milliseconds are for an ARM processor operating at 40 MHz.

FIG. 15 shows generic Controller and Observer classes, being the bridge between a system model, according to the invention, and a generic GUI.

DETAILED DESCRIPTION OF THE ILLUSTRATIVE EMBODIMENTS

Figures 1, 2:
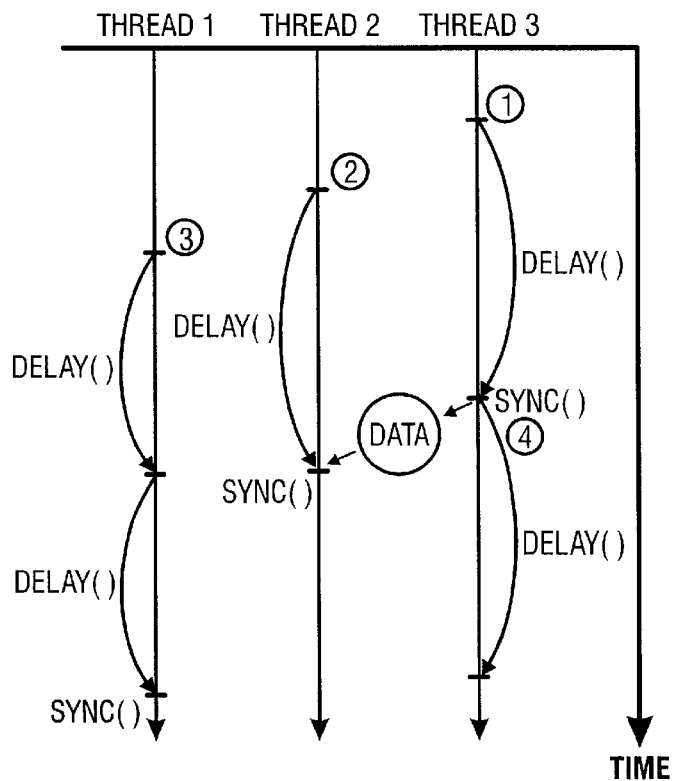
FIG. 1 is a description of a digital system as a set of threads.
FIG. 2 shows scheduling and concurrent execution (*).

The present invention will be described with reference to certain embodiments and to certain figures but the invention is not limited thereto but only by the claims. The terminology used is based on the proposals of the RASSP Taxonomy Working Group, see RASSP *Taxonomy Working Group, RASSP VHDL Modeling Terminology and Taxonomy*, revision 2.3, Jun. 23, 1998 http://www.atl.external.lmco.com/rassp/taxon/rassp_taxon.html. Behaviour is seen as the combination of functionality and architecture, and a purely functional model makes an abstraction of timing. A model that concentrates on timing aspects and makes abstraction of functionality is called a performance model. Both models can be very abstract or very detailed. Abstraction is the opposite of detail, resolution or precision, which can apply to timing as well as functionality or structure; an abstract model is not necessarily purely functional. Precision, the opposite of abstraction, is not a synonym for accuracy; a model can be very abstract, yet accurate, or very detailed, but inaccurate.

The present invention relates to the design of an essentially digital system. As one example of digital systems, these may perform real-time transformations on time discrete digitised samples of analogue quantities. An example of such a system is a digital communication system. The transformations on the data can be specified in a programming language and executed on a processor such as a programmable processor or directly on application specific hardware. In accordance with the present invention the digital system is described as a set of threads in a description language. Alternative names for a thread are tasks and processes. The set of threads defines a representation or model of the digital system. In accordance with the present invention, the representation or model is preferably executable at each stage of the design independent of the current level of abstraction of that representation or model. With description language is meant a programming language. In accordance with the present invention each of the threads has a variable having an assignable value which represents the "local time" of said thread, i.e. a time associated only with that thread, which can be used for sequencing the processing of that thread with respect to other threads. With the word "local" is meant that the time is an attribute of the thread only. In accordance with the present invention a means is provided for the designer to assign a delay to each thread or operation within a thread, this delay representing for instance the processing time for the respective operation or thread on a processing engine, e.g. a computer. By this means, not only can the processing of threads be scheduled but also the designer may assign a value representative of an elapsed time for the processing of a thread or operation on a processing engine. In addition, the threads may be refined concurrently, while still keeping their local time so that after the refining process the new representation of the digital system is executable, i.e. the processing of the refined threads can be scheduled without divergence from the specification.

A distinction is made in the present invention between real time, simulated time and simulation time. Real time is the quantity measured by a wall clock. Simulated time is time in the represented digital system. Simulated time is the time as could be observed if the digital system was implemented. Simulation time is the time necessary to simulate the representation of said digital system on the available computing means. This simulation is not meant to be in real time. The local time associated with a thread is simulated time. Simulated time thus typically refers to the physical or real time necessary to perform the function for which it is to be designed. Naturally said simulated time and said physical time are not necessarily identical. As long as said simulated time can be mapped in a unique way to said physical time, a proper way of interpretation is possible. It must be emphasized that because the local time concept is used while designing an essentially digital system, said local time is most often not an accurate value of the physical time but an estimate of this physical time. Typically the accuracy of said estimate improves while the design is proceeding. One must also consider that in certain cases, for instance while pre-empting a thread or task temporarily, one can still continue simulating said thread if certain precautions are taken. This is explained in detail later on. The local time is then temporily not linked to the physical time. Naturally sufficient care must be taken such that when said local time must be interpreted as the physical time, that this when threads are not pre-empted, that then this local time is one-to-one related to said physical time.

A digital system can be simulated using the representations generated by the methods in accordance with the present invention. Simulation of a digital system is an implementation of the digital system on a simulation processing engine which may include one or more general purpose computers.

In accordance with the present invention a representation of a digital system is generated as a set of threads and at least part of the threads are refined concurrently. It is not decided at this moment what processes will be implemented on what kind of target processor. By refining in a global sense is meant converting or translating or transforming a specification of the digital system, e.g. an electronic system, into an implementation. The implementation can be a plurality of components that have the same behaviour as defined by the specification of the system. The implementation in accordance with the present invention can be one part of a chain of design processes leading to the final implementation. Refining in a narrow sense means modifying a component of the design so as to move the complete design closer to the final implementation. With each new representation more detail is added to the representation of the digital system. Adding detail means that a part of the implementation is made more concrete or precise or specific in the chain of design processes leading to the final implementation.

A thread comprises a sequentially ordered set of operations. A thread contains code in the description language. The code in a thread is executed on a processing engine in accordance with the semantics of the description language. Refinement of a thread can be replacing the thread with a set of new threads, or adding more operations to the set of operations in a particular thread in order to increase the detail in the functionality and/or timing description of the thread. Another way of refinement can be merging of some threads as this can also mean progressing more concretely towards the final implementation and thus includes adding more detail.

The design method in accordance with the present invention enables description of a digital system at all possible abstraction levels. The present invention is particularly useful when the first representation of the digital system is generally at a high level, for example, a portion of the representation at a level higher than the register transfer level. Moreover, the present invention enables mixed abstraction level descriptions within one representation of the digital system as each of said threads can be modelled with the appropriate abstraction level for that thread. Each of the threads can be refined without considering the other threads. The level of abstraction of a thread is not limited by the abstraction level used in the other threads. In accordance with one aspect of the present invention, the manner of refinement of threads without considering the other threads is denoted in the description of the present invention as concurrent refinement in the design flow.

Besides concurrent refinement in the design flow as discussed above the design method in accordance with the present invention implicitly enables simultaneous and independent refinement of different aspects, such as structure, functionality and timing, of the digital system. In the context of the present invention and its claims, concurrent refinement may mean both concurrent refinement in the design flow and simultaneous refinement of different aspects of the digital system.

In accordance with the present invention each of the threads is associated with a variable whose value is a "local time" of that thread. Hence, timing is included explicitly in any representation of the digital system in accordance with the present invention, even when the representation is at a high abstraction level.

The design method in accordance with the present invention may be terminated when sufficient granularity or detail has been obtained for the representation of the digital system. For instance, the design can be terminated when the timing, functionality and architectural or structural aspects of the digital system have been accurately described by a refined set of threads. Another possibility is that the design method can terminate when the refined representation is detailed enough such that it can be used for automatic synthesis tools, i.e. it is sufficiently detailed that the representation may be used as the input script of known synthesis tools, e.g. tools able to generate a VHDL code and/or net lists from an input specification. Hence, in accordance with the present invention, the predetermined threshold for the granularity which triggers termination of the design may depend upon the application of the representation produced.

In accordance with the present invention any representation (or model) of the digital system obtained through concurrent refining of the threads in accordance with the design method of the present invention can be evaluated by at each step of the design process, i.e. with each level of refinement of the representation. This implies that these representations or models are executable. The operation of the digital system can be simulated with these representations or models at any time during the design process. This constraint on the models or representations in accordance with the present invention may be called executable system modelling.

In the executable system modelling in accordance with the present invention each representation of the digital system is organised as a set of threads and the execution is organised in a thread-by-thread manner. Such an approach may be called a multi-threading approach. A thread is a sequence of operations expressed in the description language. Any executable statement of the description language is an operation. A variable is a container for data. Variables can be read and written; reads and writes are collectively called accesses. A shared variable is a variable that can be accessed by more than one thread. A local variable is a variable that can be accessed by at most one thread.

In accordance with a first embodiment of the present invention a scheduler may be provided to determine which thread is the next thread to be executed during execution of a representation of the digital system. Whenever the scheduler has to decide which thread should start executing, all the threads may be placed on a stack, sorted in accordance to specific criteria and the thread on top of the stack is then executed.

In the present invention the model is concurrent or the system representation is concurrently executed, that is threads define the order in which operations within a single thread are executed, but do not impose any ordering between operations in different threads. Subject to scheduling restrictions, the operations of different threads can be arbitrarily interleaved or executed in parallel. Interleaving means that operations from different threads are executed sequentially in real time during simulation.

A model or representation in accordance with the present invention is timed, every operation in a thread is associated with a specific value of simulated time. An operation is said to execute at that time. The time at which operations execute in a thread increases monotonically, i.e. if operation A appears before operation B in the sequence of operations of a thread, operation A always executes at a time smaller than (having a lower value than) or equal to the time at which B executes. The local time of a thread is defined as the time at which the next operation will execute in that thread. The duration of an operation is the amount by which the local time of a thread increases during execution of that operation in that thread. The duration of an operation is never negative. In accordance with an embodiment of the present invention the duration of all operations with the exception of some particular operations is considered to be zero although the invention is not limited thereto. Instead local time changes associated with a thread are introduced by the designer using specific pre-defined operations e.g. delay, explained below.

A valid scheduler controls the execution of the threads in a model in such a way that accesses to shared variables are executed in order of increasing simulated time, and that accesses at the same simulated time are executed sequentially. If operations A and B both access a variable V, and A executes before B in simulated time, a valid scheduler must ensure that A also executes before B in real time. If operations have a non-zero duration in real time, the access to V in A must be complete before the access to V in B can start. If operations A and B both access a variable V at the same simulated time, a valid scheduler must ensure that A and B do not execute simultaneously in real time. If operations have a non-zero duration in real time, the access to V in A must be complete before the access to V in B can start, or vice versa; the accesses to V must not overlap in real time. This rule ensures that accesses are atomic, i.e. cannot be interrupted by other accesses to the same variable.

Local variables are automatically accessed in order of increasing time as they are within one thread and these accesses to a local variable are, therefore, automatically sequentialized. A valid scheduler only needs to consider variables shared by two or more threads.

When two or more threads access a variable at the same simulated time, the scheduler must choose which thread to execute first. Different choices may yield different behaviours of the model. Different choices correspond to different valid schedulers and different embodiments of the present invention.

In accordance with the first embodiment of the present invention a sequential scheduling approach has been described in which one thread is executed at a time. In accordance with a second embodiment of the present invention parallel scheduling is provided. Parallel execution means that operations from different threads are executed simultaneously in real time. Simultaneous execution of operations in real time requires appropriate multi-processing hardware. A scheduler in accordance with the first embodiment is called sequential if it allows at most one thread to execute at a time. A scheduler in accordance with the second embodiment is called parallel if it can allow more than one thread to execute simultaneously in real time. A parallel scheduler can exploit multi-processor hardware to speed up the execution of a model in real time.

A particular advantage of a simulation or execution of the digital system in accordance with the present invention is that it is efficient, meaning rapid. This can be realised by avoiding context switching. A thread may have some local variables which are accessed by the operations of the thread. When a thread starts executing the local variables are loaded, resulting in some time overhead. This loading is called a context switch. In accordance with an embodiment of the present invention concurrent execution is used and synchronisation is only carried out when shared variables are accessed. This reduces context switches as much as possible.

The present invention includes concurrency in the design flow, concurrent refinement of different aspects of the design and concurrent execution of the threads of a representation. Also the avoidance of context switching and parallel scheduling whenever possible are two orthogonal approaches for increasing simulation efficiency and speed in accordance with the present invention.

In accordance with the present invention a thread is said to be synchronised with another thread when the local time of the first thread is smaller than or equal to the local time of the second thread. A thread is synchronised with respect to a variable when it is synchronised with all threads that can access that variable at or before the local time of the thread in question. A thread is globally synchronised when it is synchronised with all other threads in the model.

The scheduling rules for a valid scheduler can be reformulated in terms of synchronisation. A valid scheduler preferably ensures that a thread can only access a shared variable when it is synchronised with respect to that variable. If an unsynchronised thread is allowed to access a shared variable, there is a thread with a smaller local time that can access the variable at the same real time as or after the unsynchronised thread. When more than one thread accessing a shared variable is synchronised with respect to that variable, a valid scheduler must not allow more than one of these threads to execute simultaneously in real time.

A scheduler does not need to organise the execution of operations in a thread in accordance with the present invention. A scheduler need only select which thread must be executed next. So ensuring that a valid model or representation of a digital system is obtained is preferably at least partly done by adding some particular operations which give control back to the scheduler.

In accordance with one embodiment of the present invention a scheduler, guaranteeing valid simulations selects the thread with the smallest local time as the next thread to be executed. When there is more than one thread with the same smallest local time, an execution rule in accordance with an embodiment of the present invention is to select the thread that has not been executed for the longest period of real time. In another embodiment, when there is more than one thread with the same smallest local time, the currently executing thread is selected when possible in order to avoid context switches. A context switch can occur when one thread is stopped and another thread started, avoiding context switches saves some time overhead and thus increases the efficiency of the simulation. Execution of a thread can preferably only continue if the thread is still synchronised, i.e. if the local time of the thread is still smaller than or equal to the local time of all other threads in the model.

Generally available programming languages do not have the appropriate operations enabling executable system modelling including concurrent execution of threads and avoidance of context switching in accordance with the present invention. Conventional description languages need to be extended in accordance with the present invention with a set of operations supporting the novel features of the present invention. These additional operations are denoted functions, to distinguish them from the operations already supported by the known description language. An alternative name is a primitive. Threads are sequentially ordered sets of operations, whereby these operations may also include also these new functions. It can be stated that the functions operate on threads, as due to their appearance in the ordered set of operations of a thread, something is happening to that thread. Note that the duration of all operations and primitives except for certain specific operations such as the delay and suspend primitives defined below, are considered to take up zero time.

A spawn function or primitive in accordance with the present invention creates a new thread executing a specified sequence of operations. The local time of the new thread is initialised to the time at which the spawn function or primitive is executed.

It is clear that in order to build a representation of the digital system comprising of threads with one local time, the description language must be extended with a function (the spawn function), creating such threads. A representation of a digital system can then look schematically as in FIG. 1. The main thread represents the main function of the program, describing the digital system. This main thread creates the initial threads by calling the spawn function. The run function starts then execution of the model by calling the scheduler as described above. The spawn function can be invoked by other threads than the main thread and as such supports dynamic process creation.

The now primitive returns the local time to the thread executing it. The self primitive returns an identification of the thread executing it. The delay primitive increments the local time of the thread that executes it by a specified, non-negative amount. The delay primitive allows the designer to simulate an elapsed process time when the thread is executed on a processing engine. An operation in a high level description of a digital system does not generally have any specific relationship to the processing time of that operation on a processing engine. In accordance with the present invention, the designer may select an elapsed process time for an operation or a complete thread and specify this using the delay primitive. This simulated elapsed process time is local to the thread with which it is associated. For example, the designer may select a processing time for an operation from experience, from a library of actually measured times for similar operations or may be provided with a time for the relevant operation from a separate design tool.

The sync primitive synchronises the thread that executes it with a specified set of threads. This set of threads can be specified directly by listing the threads, or indirectly, for example by listing variables with respect to which the threads should be synchronised, or by requesting global synchronisation. After execution of the sync primitive, a thread is guaranteed to be synchronised with all threads in the specified set until it executes a delay primitive (or a suspend primitive, defined below). The kill primitive deletes an existing thread. The killed thread is deleted as soon as it executes a sync (or suspend primitive, defined below) at a local time greater than or equal to the time at which the kill primitive was executed.

A valid model in accordance with the present invention is a model in which a thread only accesses a shared variable when it is guaranteed to be synchronised with respect to that variable. A thread is guaranteed to be synchronised with respect to a variable at a given time when it is guaranteed to be synchronised with all threads that can access that variable before or at that time, and at or after the previous synchronisation. It is not necessary to be synchronised with a thread with which the first thread was synchronised before, and that only accesses the variable before the synchronisation time. A thread is guaranteed to be synchronised with another thread between the execution of a sync (or suspend primitive including the other thread in the specified set of thread or a resume primitive specifying the other thread), and the next execution of a delay (or suspend primitive). A scheduler is called global if it ignores the set of threads specified with the sync (or suspend) primitives and replaces it by the set of all threads in the model. Such a scheduler cannot exploit locality of communication in the model. A scheduler exploiting locality of communication in the model is called a local scheduler in accordance with the present invention.

Multiple threads can execute the same code and access the same data. It is often desirable to encapsulate a thread or a set of related threads together with its or their private data. This can be achieved elegantly in an object-oriented language by calling the spawn function for defining a thread in the constructor of a class with private data members. Encapsulated threads are then defined as an object of such class, each having their own data, which can only be accessed by that thread or through public access functions, explicitly provided for that purpose, by other threads. The definition of such an encapsulated thread is given schematically in FIG. 3. When threads access the same data, it must be guaranteed that they access this shared data in the correct order. By calling the sync function just before communication takes place, this is realised. As the sync function must be called whenever threads access the shared data, means can be provided such that this is automated. In an object-oriented language this can, for instance, be realised by encapsulating such shared data in a class (thus also representing it as an object) that automatically calls sync before every access. The definition of such a class is given in FIG. 4.

The suspend primitive suspends execution of the thread that executes it or another specified thread, until it is either resumed by another thread using the resume primitive or a specified non-negative timeout expires, whichever occurs first in simulated time. When both events occur at the same simulated time, the scheduler is free to honour either one or the other. When the thread is resumed by another thread, its local time is set equal to the time at which the resume primitive was executed. When the thread is resumed by a time-out, its local time is set equal to the time at which the suspend primitive was executed plus the specified time-out. A thread can only be resumed by one of a specified set of threads. The set of threads can again be specified directly or indirectly, and can contain all threads. After execution of the suspend primitive, the thread is guaranteed to be synchronised with all threads in the specified set. A time-out occurs when all threads in the specified set have a local time greater than or equal to the time at which the suspend primitive was executed plus the specified time-out. The resume primitive resumes a specified thread if it is suspended when the resume primitive is executed. After execution of a resume primitive, the thread executing the resume primitive is synchronised with the specified thread.

Note that in a valid model in accordance with the present invention, the first sync (or suspend) executed by a killed thread must include the killing thread in the specified set of tasks. Indeed with non-pre-emptive scheduling, the scheduler cannot terminate a thread immediately when another thread executes the kill primitive; the scheduler must wait until the killed thread executes a sync or suspend primitive. Allowing a killed thread to continue running for some time is acceptable as long as the killed thread no longer communicates with other threads, and thus does not change the externally visible behaviour of the model. The above rule ensures that a killed thread is aborted before it can communicate with other threads. In a valid model, also the first sync (or suspend) executed by a thread suspended by another thread must include the suspending thread in the specified set of tasks. Indeed with non-pre-emptive scheduling, the scheduler cannot suspend a thread immediately when another thread executes the suspend primitive for this thread; the scheduler must wait until the suspended thread executes a sync or suspend primitive. Allowing a suspended thread to continue running for some time is acceptable as long as the suspended thread does not communicate with other threads, and thus does not change the externally visible behaviour of the model. The above rule ensures that a thread suspended by another thread is actually suspended before it can communicate with other threads. In a valid model, a thread can only be resumed by one of the threads in the set specified when the thread was suspended.

A scheduler in accordance with the present invention is a mechanism that controls the (optionally interleaved and parallel) execution of threads in a model. A scheduler is non-pre-emptive if it only stops the execution of a thread when the thread executes specific primitives. Once execution of a thread under control of a non-pre-emptive scheduler has started, it will proceed at a rate that is not under control of the scheduler and will not stop until one of these primitives is executed. A pre-emptive scheduler can stop threads at any time, including during the execution of operations that are not primitives. Both no-pre-emptive and pre-emptive schedulers are individual embodiments of the present invention. A non-pre-emptive scheduler is generally easier to implement and more efficient than a pre-emptive scheduler.

In accordance with an embodiment of the present invention the interaction between a model and its non-pre-emptive scheduler can be limited to the primitives. The primitives have been defined such that a valid non-pre-emptive scheduler can be implemented. A valid pre-emptive scheduler is however also implementable. In accordance with an embodiment of the present invention execution of a thread is paused when either the synchronisation or the suspend function operates on the thread. Thus the specific primitives may be sync and suspend.

In accordance with one embodiment of the present invention use is made of a valid non-pre-emptive global sequential scheduler with round-robin scheduling when it has a choice. This scheduler repeatedly starts the non-suspended thread with the smallest local time, and stops that thread when it executes a sync or suspend primitive. When there is more than one non-suspended thread with the same smallest local time, the scheduler in accordance with this embodiment may select the thread that has not been executed for the longest period of real time.

In accordance with another embodiment a valid non-pre-emptive global sequential scheduler is provided which does not use round-robin scheduling when it has a choice. Instead, it continues execution of the currently executing thread when possible to avoid context switches. A context switch occurs when one thread is stopped and another thread started; context switches involve some overhead and thus reduce the efficiency of the simulation. When a thread executes a sync or suspend primitive, execution of that thread can only be continued if the thread is still synchronised, i.e. if the local time of the thread is still smaller than or equal to the local time of all other threads in the model. In accordance with another embodiment support for hierarchical models is provided. A scheduler in accordance with this embodiment is still a valid non-pre-emptive sequential scheduler, but is no longer global. When threads in the same branch of the hierarchy communicate, the scheduler in accordance with this embodiment only synchronises the threads in that branch of the hierarchy. This again reduces the number of context switches.

Scheduling and concurrent execution is illustrated with an example in FIG. 2. Initially thread 3 is running, until it calls the sync() function, because it intends to write to shared data. At this point threads 1 and 2 have a smaller simulated time than thread 3, so they are now scheduled to run until they in turn call the sync() function. Now thread 3 can proceed, and write to data. This guarantees that when thread 3 will read data, it will be up-to-date.

In order to avoid complex bookkeeping while using any of the design methods of the present invention, additional program constructs enabling mutually exclusive access to shared resources may be provided by exploiting the suspend and resume functions. A thread trying to access a resource while another thread is accessing it is blocked until the other thread releases the resource. In an object-oriented language mutex and lock are defined as classes. The Lock constructor is called automatically when a thread enters a protected piece of code in a function. It attempts to lock the semaphore. If the semaphore is already locked, for example because another thread is already executing the function f, the calling thread is suspended. The Lock destructor is automatically called when the protected piece of code of the function f is executed. If there are other threads waiting to lock the semaphore, it resumes the next waiting thread; otherwise, it unlocks the semaphore.

In an object-oriented language the program constructs mutex and lock are defined by their public interface as shown in FIG. 6. Its use is given as in FIG. 5. When a thread calls the function f while this function is already in use by another thread, the thread last calling the function is suspended and resumed whenever the function becomes available. When no thread is called the function is unlocked.

In order to avoid complex bookkeeping while using the design method in accordance with the present invention, additional program constructs enabling a thread to wait until some event occurs in another thread may be provided by exploiting the suspend and resume functions.

The Signal class allows a thread to wait until some event occurs in another thread. The event is transmitted between the threads through the signal. A thread that calls wait() on a signal is suspended until another thread calls emit() on that signal. Calling emit() on a signal resumes all threads waiting for that signal. In an object-oriented language the program construct signal is defined by its public interface as shown in FIG. 6.

Note that in principle in the present invention blocking is supported with the suspend and resume functions. A thread can suspend itself by calling suspend(). It will then not execute until another thread resumes it by calling resume (suspended_thread). The local time of a resumed thread is set equal to the local time of the thread calling resume. Since suspend implies interthread communication, it automatically calls sync(). The argument to the resume function is a thread identification. The thread identification of the current thread is returned by the function self(). Before a thread suspends itself, it must make sure that its thread identification is available to at least one other thread that can resume it. As this is not a very user-friendly approach, auxiliary program constructs and primitives to do the thread identification book-keeping are provided in accordance with an embodiment of the present invention in addition to suspend/resume, mutex, lock and signal.

The description language which may be used with the present invention may be, in principle, any known programming language. Object-oriented languages however have some advantages of which C++ and JAVA are examples. When an object-oriented language is used, the threads are then preferably represented as objects. Also the other program constructs described above can be defined as objects as well. The functions defined above are then methods of said objects.

The design method supporting concurrency and timing even at high abstraction levels in accordance with the present invention is embedded in a design environment. The design environment comprises a description language enabling representation of a digital system. This representation is a set of threads. Each of the threads has a variable whose value is representation of on "local time". The design environment preferably has a scheduler for executing the threads following any one of the particular execution rules based on the local time described above.

The description language used with the present invention is preferably extended with a set of functions. The set of functions includes a function creating a thread associated with one local time, a function returning the time of a thread, a function incrementing the local time of a thread, a synchronising function synchronising a thread, a suspend function suspending a thread for a specified amount of time, a resume function enabling a thread to resuming another suspended thread and a function returning an identification of a thread. The description language is also preferably extended with program constructs. The program constructs enable mutually exclusive access to shared resources and enable a thread to wait until some event occurs in another thread, by exploiting the suspend function and resume functions. The design environment has means for easy interaction with the designer. These means enable concurrent refinement of the set of threads which make up a representation of the digital system.

Embodiments of the present invention have been implemented with the description language C++ combined with UNIX in which multi-tasking facilities have been exploited although the present invention is not limited to this. The invention could equally well be implemented in any other object-oriented language such as JAVA or even conventional high level languages such as C or Pascal combined with any other operating system with multi-tasking facilities such as Windows NT. The current implementation is compiled with the GNU C++ compiler version 2.8.0, and works on HP-UX10. Implementations have also been prepared on SunOs, Solaris and LINUX on PC. The description language (an object-oriented language extended with a library, comprising the primitives and program constructs described above) has a layered software architecture as shown schematically in FIG. 9. The foundation 1 is provided by UNIX setjmp/longimp system calls together with some (non-portable) direct stack manipulations. Another more portable multi-threading mechanism such as pthread can be substituted without any effect on the functionality of the higher layers. The stack manipulations are used to implement multi-threading and context switching. The "ease-of-use" layer 4, just below the application layer 9, can easily be extended with new abstractions needed for a specific application or class of applications, based on the primitives provided by the TimeThread layer 3. The next layer 2, the thread class, provides basic non-pre-emptive multi-threading. It hides the multi-threading implementation from the rest of the library. At this level, context switches occur only when the current thread explicitly passes control to another thread. The functionality of the thread and time thread class is probably best described by its public interface as shown best in FIGS. 7 and 8. The timethread class is derived from the thread class and adds a local time, a scheduler, and suspend and resume functions. Timethread layer 3 provides in principle the complete functionality, but is not always easy to use (e.g. sync() needed before every interthread communication, explicit manipulation of thread identification for suspend/resume). The functions now(), delay(), sync(), and suspend() are all static and operate on the current time thread. The resume() function is not static, but implicitly resumes the thread from the current thread (and copies the local time from the current thread to the resumed thread). It is included within the present invention to make these functions all non-static, but this is not preferred for two reasons: (1) threads are not supposed to directly manipulate the local time of other threads or simulate a suspend, resume or sync call from these threads and (2) if threads can only change their own local time, the scheduler can be implemented more efficiently. The "ease-of-use" layer 4 translates the primitive functionality provided by timethread layer 3 into constructs, classes and functions that are directly usable in a system model. This layer 4 can easily be extended with new abstractions needed for example for a specific application or class of applications. Such extensions can easily be reused in other executable system models, as they use the same model of time and concurrency.

With the inventive concepts, it is possible to create very abstract models e.g., functional or conceptual models or performance models as well as very detailed cycle-true models (Stan Liao, Steve Tjiang, Rajesh Gupta, *An efficient Implementation of Reactivity for Modeling Hardware in the Scenic Design Environment*,DAC'97proceedings,http://www.sigda.acm.org/34dac/papers/1997/dac97/psfiles/03_4.ps) and intermediate levels of abstraction, in one environment. This can support the gradual refinement of an initial, very abstract model to a detailed model, while allowing the designer to fix or refine the key parts first, rather than forcing him/her to completely fix functionality before being able to model time related behaviour or architectural or structural choices. The inventive concepts support a concurrent design methodology.

In the above a design method and environment have been described which meets the requirement of top-down refinement while introducing timing data at all stages of the refinement process. In accordance with any embodiment of the present invention the initial level of at least a portion of the very first representation is at a higher abstraction level than the register transfer level. Further, any representation in accordance with the present invention is executable. Mixed abstraction levels are allowed in the representation at all stages of the design. Further, by using the delay primitive in any of the embodiments of the present invention an elapsed processing time for an operation can be assigned to any thread. Hence, in accordance with the present invention the "local time" of a thread may include an estimate of the elapsed processing time for that thread when the thread is executed on a processing engine. The progress of the design can be checked at any stage by executing the representation, the local timing data of the threads being used to control the sequencing of the processes by means of a scheduler.

Both hardware and software aspects of a system should be captured in an executable system model. The distinction between hardware and software may be irrelevant in a very abstract system model, but is essential when taking design decisions such as hardware-software partitioning and the selection of a processor, RTOS, scheduler, task/thread priorities, and hardware-software communication mechanisms.

Therefore, in an aspect of the invention software modeling is presented by including a few key constructs for software modeling to the invented method and design environment.

A design flow for embedded systems may start from a conceptual description of the system without distinguishing between hardware and software, but must at some point support the introduction and refinement of real-time embedded software. If the design flow is based on an executable system model, the executable system model must be able to capture the effects of software introduction and refinement.

With the invention an executable system model can capture a conceptual system model and does support software modeling by using some constructs. Software modeling comprises of the following aspects: design or selection of software processors, the assignment of tasks/threads to these processors, and the scheduling of these tasks/threads on these processors.

It is assumed that a conceptual executable model of the tasks/threads exists, and that the assignment of tasks to software processors and the scheduling of these tasks/threads is driven by timing constraints. If no executable model is available, the kind of exploration proposed is not possible. If only detailed code is available, it is possible but more cumbersome or constrained; for example, if the code is written for a specific RTOS, exploring the use of another RTOS is not easy. If timing constraints are not important, the software modeling support created is mostly irrelevant.

The software modeling aspect of the invention comprises of timing constraint based assignment of tasks to software processors and the scheduling of said tasks. Recall that tasks are also denoted threads.

Assigning a task to a software processor has three effects on the timing of that task:
  the execution speed of the task is a function of the processor performance;
  the execution speed of the task is reduced because of time multiplexing with other tasks;
  the task's reaction time when resumed is slower because of time multiplexing.

The execution speed of a task is captured in a model according to the invention by using delay calls; the argument to the delay call is the estimated execution time of the code segment in which the call occurs, ignoring preemption. The estimation of execution times is a problem that has been studied by others (for example a mechanism based on a count of operations of different types in each task, and a table of execution time of each type of operation for each supported processor can be exploited); these results can easily be included in a model using the delay() function. Note that with preemption is meant stopping execution of the task or thread being preempted in the real world due to an external event, also denoted an interrupt.

The key problem to be solved to enable the modeling of software in the invented design environment is therefore the modeling of the time multiplexing of tasks assigned to a software processor. More specifically, two issues need to be resolved:
1) The modeling of preemption with a non-preemptive kernel. Indeed with the basic primitives of the invention interrupts are not modeled.
2) The modeling of software schedulers in a way that allows easy exploration of alternatives, consistent with the invented concurrent refinement principle.

Preemption of software tasks is very common in embedded systems; many RTOS schedulers are preemptive, and hardware interrupts are intrinsically preemptive. Non-preemptive scheduling also occurs, but is not a modeling problem, as it can be mapped directly to the invented primitives. To enable the modeling of preemption, the invented kernel is extended. It is not necessary to make the kernel itself preemptive; thus, the modeling of preemption does not seriously complicate the creation or debugging of a system model, made according to the invented concepts.

To allow easy exploration, scheduler models should be independent of the scheduled tasks. It should be possible to assign an existing task to a processor with a scheduler and select scheduling parameters such as task priority without changing the task code. A time-sliced round-robin scheduler, a priority-based scheduler and an interrupt model are presented. These schedulers support such exploration.

The approach is validated for a simplified software model for a chip which has an embedded ARM processor. Said model consists of four periodic tasks with a built-in deadline check. Execution of this model stand-alone, then with the round-robin scheduler, the priority-based scheduler, and the interrupt model, are performed. These experiments allowed us to verify software scheduling decisions taken based on theoretical considerations, and to locate a bug in the synchronization between the initialization of hardware and software in said model. Naturally the invention is not limited to such simplified models.

For many designs, the next refinement step after assigning all software tasks to a processor and fixing all scheduling parameters is to introduce a more detailed RTOS model and replace the generic communication and synchronization primitives used in the task code by RTOS-specific primitives. A sufficiently detailed RTOS model, together with a virtual prototype of the system hardware, can in principle be used to fully develop and debug the embedded software of a not-yet-existing system. The present design method and library of primitives can handle this easily.

Figure 10:
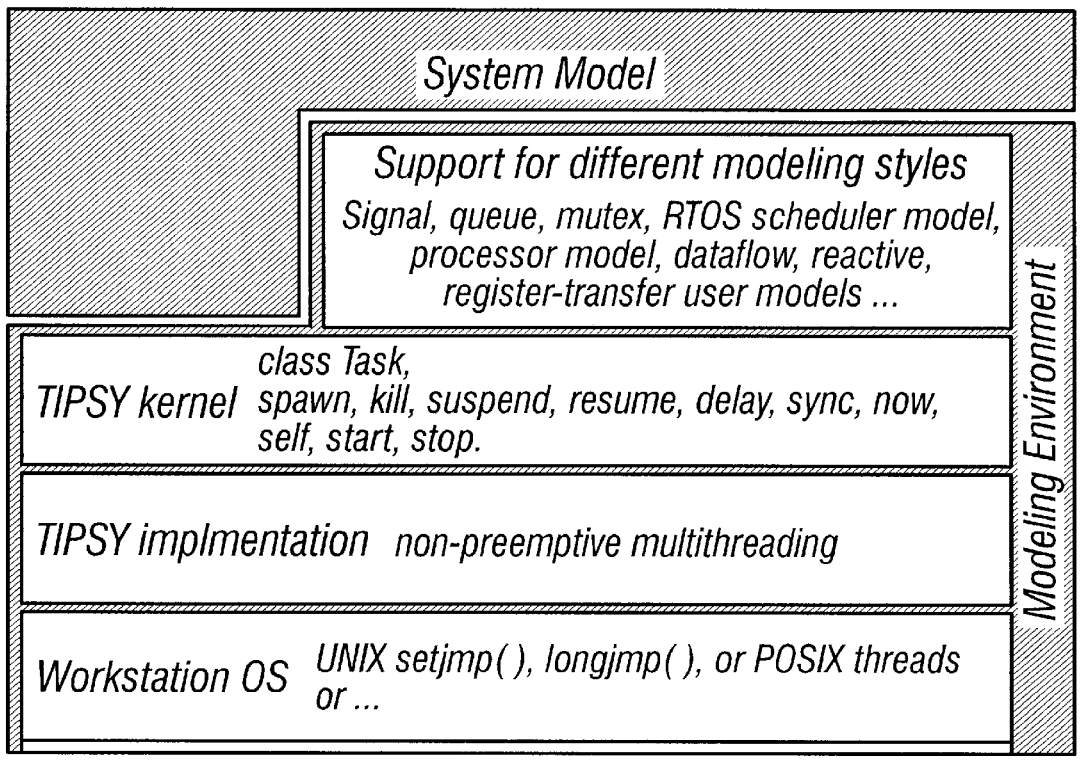
FIG. 10 shows the invented kernel layer contains only minimal support for preemption (stop and start functions on the Task class); most of the code for the modeling of preemptive schedulers, interrupts, etc., is in the support layer.

The invented kernel has been extended to support preemption. These extensions were kept minimal in order to not introduce an overhead for non-software or non-preempted tasks. The bulk of the code for the modeling of preemptive schedulers, interrupts, etc., is part of the support layer (FIG. 10)

To model the effect of preemption of a task at an arbitrary point during its execution, it is sufficient to add the time during which the task was preempted to the local time of the preempted task at the next call of the sync function. Indeed, the only direct effect of preempting a task is an additional delay (called "preemption-delay") in the execution of that task. Any indirect effect, caused by the changed timing of the communication of the task with the rest of the system, only manifests itself after the next sync call: in a valid system model according to the invention, a task always calls the sync function before communicating.

In an embodiment of the invention pre-emption of a task/thread is modelled via adding the pre-emption time to the local time.

It is therefore not necessary to make the execution of threads or tasks preemptive to be able to model preemptive execution. The execution of a TIPSY-based system model remains non-preemptive: execution of a task can only be interrupted when the task calls the sync function (or the suspend function, which in turn calls sync).

This way of modeling preemption is efficient: execution of the task code is basically as fast as without preemption. An alternative way to model preemption in a non-preemptive environment would be to use an interpreter for the task code (e.g. a model of the target processor) and implement preemption on that interpreter, but this leads to a much slower execution of the task code due to the extra layer of indirection.

Figure 11:
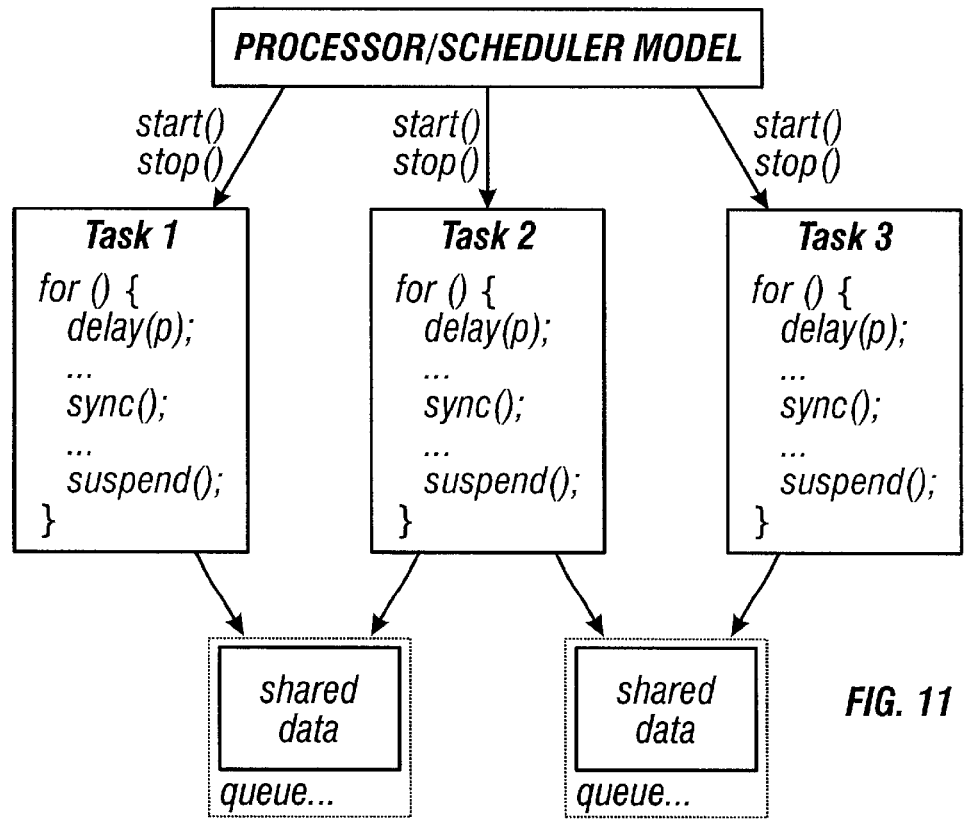
FIG. 11 shows the start and stop functions allow the development of a processor/scheduler model independent of the controlled tasks. The code of the controlled tasks is unchanged and communicates with other tasks using shared data, possibly encapsulated in other communication primitives such as queues, without taking preemption into account.
Figure 12:
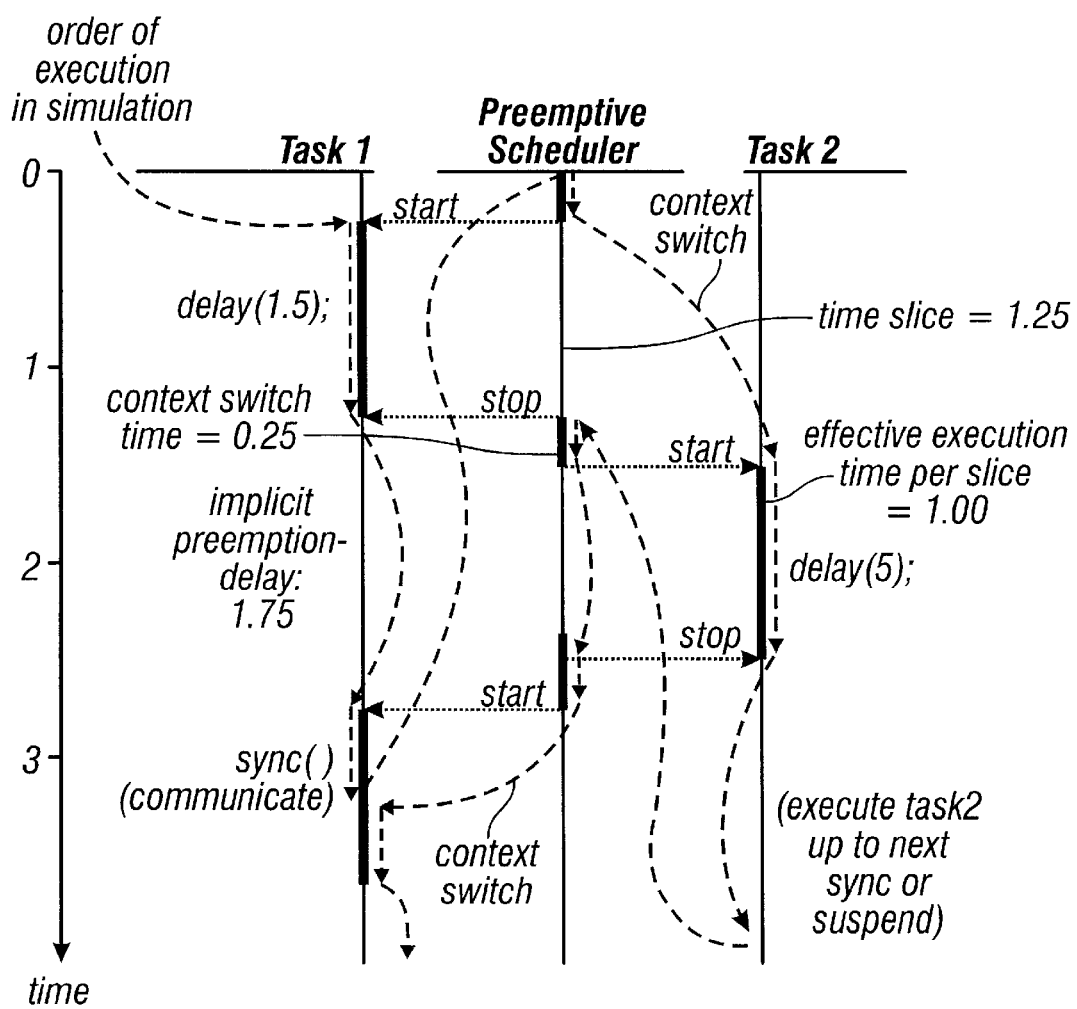
FIG. 12 shows two tasks running under control of a time-sliced round-robin scheduler. In this example and assuming a light-weight scheduler task, there are 5 context switches in the real system (dotted horizontal lines) but only 2 in the simulation (curved arrows labeled "context switch").
Figure 16:
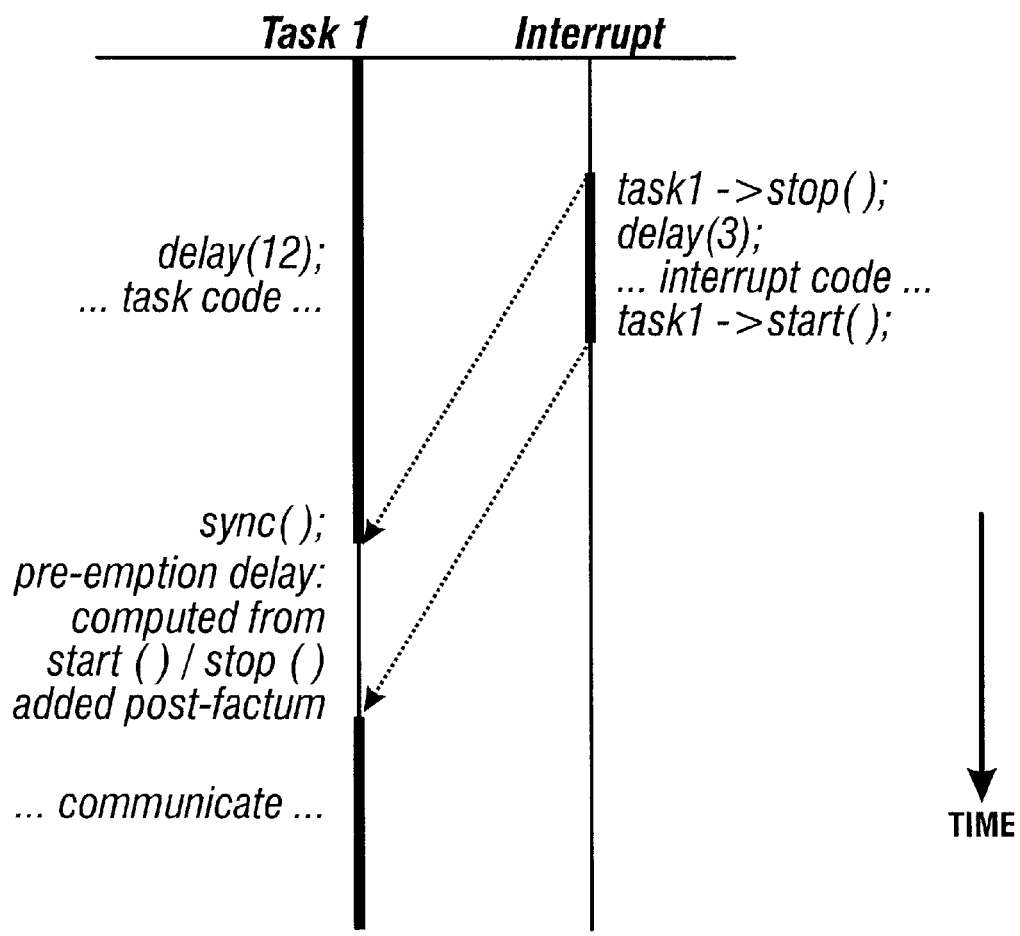
FIG. 16 shows how pre-emption is taken care of in the invention. Task is interrupted or pre-empted by a second task or thread, denoted here Interrupt. In order to avoid unnecessary context-switching, the simulation of said pre-empted thread continues until it synchronizes, for instance because it want to communicate. It is an aspect of the invention to add the delay due to pre-emption only after the sync call because the overall behaviour of the system dynamics is still consistent while dealing in this way with the timing.

To be able to compute the preemption-delay to be added in a sync call, the extended invented kernel must know when the task was preempted, and when it was restarted. This information must come from the model of the scheduler, RTOS or processor interrupts that controls the execution of the task. To allow the development of a processor, an RTOS or an interrupt model that is independent of the controlled tasks, the functions used to indicate the preemption and restarting of a task must be part of the proposed kernel. In the invention two new member functions have been implemented on the Task class: stop preempts the task, and start restarts it (FIG. 11). A call to these functions does not directly affect the execution of the task, but updates some bookkeeping information to allow the task to compute the preemption-delay at the next sync call.

In an embodiment of the invention, dedicated functions for software modeling are used, whereby said functions do not influence the execution of tasks or threads but only updates some bookkeeping information to allow the task to compute the preemption-delay at the next sync call.

At first sight, the new stop and start functions look very much like the existing suspend and resume functions. Conceptually, both stop and suspend halt the execution of a task, and both start and resume restart it. The essential difference is that suspend and resume model a functional aspect of the system (the passing of an event from one task to another) whereas start and stop model a timing aspect (the effect of preemption on execution time). One consequence is that a task can only suspend itself, but can be stopped by any task; a task can only handle events from other tasks at specific points during its execution, but can be stopped (or even killed) at any point.

Due to preemption support, the local time of a task can now increase in three TIPSY kernel calls: delay, suspend, and sync. The local time increase in delay calls represents the actual processing time of the task, the local time increase in suspend calls represents the time during which the task waits for an external event, and the local time increase in sync calls represents the preemption-delay. When a task is suspended, preempting it (by calling stop) has no effect, except that at the next resume call, it will not actually start running until start is called.

The now function, which returns the current time, must now call sync before returning the local time of the calling task, to make sure that the preemption-delay is correctly taken into account; if sync is not called, it is possible that another task, with a smaller local time, will call stop and start on the current task, and thus increase the preemption-delay to be added to obtain the correct local time. As a consequence, context switches can now occur during now calls. The now function is often used to write a timestamp to standard output or a log file. If a context switch occurs during such a now call, and other tasks also generate output on the same output stream, the output line containing the timestamp will be broken. To avoid this, task code that generates an output line containing a timestamp should call sync before generating the first output of that line. This is not surprising, as generating output is a form of external communication, and all external communication in the invented method must be preceded by a sync call.

In an embodiment of the invention, the now function calls the sync function, before returning the local time.

To avoid the overhead of context switches in the now function for tasks that are never preempted, a flag is added to each task indicating whether the task can be preempted or not. The value of this flag is decided at task construction time. If it is set, the task can be preempted (i.e. stop and start can be called) and now calls sync. If it is not set, the task cannot be preempted (calls to stop and start will fail with an assertion) and now will not call sync.

In an embodiment of the invention, a flag is introduced for avoiding context switching, said flag indicates whether a thread or task can be preempted or not.

The preemption support of the extended invented kernel is not intended to be used directly in an application model, but should be encapsulated in a number of support objects such as processor and scheduler models that will typically be stored in a library. To test such an approach, a processor class that facilitates task assignment, and three scheduler models, is implemented.

In an embodiment of the invention a particular class, facilitating task assignment and a plurality of scheduler models, is implemented. Said class exploits said preemption support.

To facilitate software related exploration, the declaration of processor and scheduler models and assignment of tasks to processors with minimal code changes, is supported. Two steps must be taken to introduce software effects in a conceptual system model:

1) Selection of one or more processor/scheduler pairs. These should ideally be taken from a library and inserted in the system model without additional changes. An example is #include ARM my_processor; //(1)

where the type 'ARM' selects a processor model (capturing only features that affect software scheduling such as interrupts) and a scheduler model.

2) Assignment of one or more tasks to each processor/scheduler pair. This is done at task construction, without changing the actual code of the task. The conceptual code spawn(function, . . . );
is replaced by my_processor.spawn(function, . . . ); //(2)

or, if the scheduler on my_processor needs additional task-specific parameters such as a priority level, by my_processor.spawn(function, . . . )-setPriority(3); //(3)

With this style of modeling, it is easy to modify the processor/scheduler selection (1), task-to-processor assignment (2), or task-specific scheduling parameters (3).

To support this style of software modeling, we have implemented a generic Processor class (as indicated below). This class supports the easy spawning of tasks controlled by the processor's scheduler. The scheduler is provided as a templated argument. Processor-specific features such as interrupts can be added in derived classes. The Processor class forms the bridge between schedulers and tasks.

```
template class Processor {
public:
    template Scheduler::Task* spawn(
        Function function,
        const char* name = 0
    );
    // Spawn for non-member function without arguments
    template Scheduler::Task* spawn(
        Function function,
        Arg1 arg1,
        const char* name = 0
    );
    // Spawn for non-member function with one argument
    . . . spawn functions for functions with more arguments
        and member functions
private:
    . . .
};
```

The generic Processor class supports the easy spawning of tasks controlled by the processor's scheduler is shown above. The spawn member functions can be used in any instantiation for a specific scheduler or derived class. The Scheduler class is assumed to have a nested Task class, which must be derived from the invented global Task class and contains scheduler-specific data such as priority levels.

A time-sliced round-robin scheduler allows tasks to run in turn for a fixed period called a time-slice. Given the start and stop functions, implementation is straight-forward. For clarity, the "heavy" task version of the code is shown here, but a light-weight task version is also possible and requires fewer context switches.

```
void RoundRobinScheduler::body( )
{
    for (;;) {
        if (_current_task) {
            _current_task-stop( );
            delay(_overhead); // context switching + scheduler overhead
            _total_overhead += _overhead;
            _current_task = _current_task-_next;
            _current_task-start( );
        }
        suspend(_slice-_overhead);
    }
}
```

A straight-forward implementation of a timesliced round-robin scheduler is shown above. All tasks assigned to the scheduler are placed in a circular linked list using _next pointers. The scheduler repeatedly stops the current task, delays to model context switching and scheduling overhead, starts the next task, and suspends itself for one time slice (minus overhead time).

To work correctly, the scheduler needs an up-to-date list of active tasks, i.e. tasks assigned to this scheduler that are not suspended. The responsibility for managing this list is given to the nested Task class. To let the nested Task class know when it is suspended or resumed, two new virtual functions (suspend_notify and resume_notify) to the kernel Task class were introduced.

In an embodiment of the invention, the tipsy kernel uses the suspend notify and the resume notify functions.

```
class RoundRobinScheduler: public Task {
public:
    RoundRobinScheduler( Time slice, Time overhead );
    virtual void body( ); // executes the round-robin scheduling
    class Task: public ::Task {
        RoundRobinScheduler* _scheduler;
        Task* _next;
        virtual void suspend_notify( );
        virtual void resume_notify( );
    public:
        Task( RoundRobinScheduler* scheduler, const char* name = 0 );
        Task( );
    };
    . . .
};
```

The RoundRobinScheduler class contains a nested Task class with task specific data needed for scheduling: a pointer _scheduler to the scheduler, and a pointer _next to the next task in the scheduler's circular linked list of active tasks. The nested class' constructor uses its scheduler to link the task to a scheduler at construction time; this constructor is called by the spawn functions of the Processor class.

With this scheduler model, tasks execute as if they were preempted, although they are not. The number of context switches in the simulation does not depend on the size of the time slices and can be much smaller than the number of context switches in the simulated system, especially if the time slices are small compared to the average time between communication points of the tasks and if the scheduler is implemented as a light-weight task. Whether the context switching overhead is relevant for simulation efficiency depends on the amount of CPU time needed for the actual code relative to the CPU time needed for a context switch.

In a conceptual model, the actual code is relatively simple (high level approximation of real behavior), so even fast context switches may have an important effect on simulation efficiency.

As the model is refined, the code gets more detailed and complex, but time is probably also modeled in more detail, so without optimization there will also be more context switches.

A priority-based scheduler always executes the highest priority task, where the priority of a task is an integer that is set by the user for each and may or may not change dynamically. The priority-based preemptive scheduler model is very similar to the round-robin scheduler described in the previous section. The nested Task class has an extra data member to store the priority, and the circular linked list is replaced by a list that is sorted by priority. The responsibility of keeping this list up to date is again given to the nested Task class. The scheduler always selects the task at the head of this list; if there is more than one task with the same priority, one is chosen arbitrarily.

Contrary to the round-robin scheduler, the priority-based scheduler does not have its own thread of control; it is not derived from Task and has no body function. Context switches occur only on "external" events: when a task suspends, is resumed, created or destroyed or a task priority changes. Still, it is preemptive: the current task stops immediately when for example another task gets a higher priority.

```
class PriorityScheduler {
public:
    PriorityScheduler( Time overhead );
    class Task: public ::Task {
        PriorityScheduler* _scheduler;
        Task* _next;
        int _priority;
        void suspend_notify( );
        void resume_notify( );
    public:
        Task(PriorityScheduler* scheduler, const char* name = 0);
        Task( );
        int priority( ) const;
        Task* priority( int p );
    };
private:
    Task* _task_list; // Sorted by priority.
};
```

The PriorityScheduler class, described above, is very similar to the RoundRobinScheduler class; the main differences are the priority field and the priority-sorted task list.

An interrupt handler is a piece of code that is executed on a processor, preempting the current task, when an external event called an interrupt is received. Interrupts have a priority, and preemption is subject to that priority. Hard interrupts are generated from hardware and require hardware support; the number of hard interrupt priority levels is therefore limited and depends on the processor used (e.g. two for ARM processor, called IRQ and FIQ). Multiple hard interrupts can be multiplexed at the same interrupt priority level if multiplexing hardware and demultiplexing software (an interrupt dispatcher) are added. Interrupts can selectively enable or disable other interrupts while running. Often, a flag is set when a disabled interrupt occurs; this flag is readable from software. It is usually not possible to see the difference between the occurrence of one or more disabled interrupts, unless the hardware provides some caching or queuing mechanism.

```
void interrupt_handler( Time execution_time )
{
    for (;;) {
        suspend( );
        delay(execution_time);
    }
}
```

A simple interrupt handler function that models the handler code as a delay call is described above.

```
class InterruptHandler: public PriorityScheduler::Task
{
public:
    void request( ) { resume(this); }
    virtual void handle( ) = 0;
    void body( ) {
        for (;;) {
            suspend( );
            handle( );
        }
    }
};
```

A interrupt handler class that generalizes the idea of the interrupt handler function.

In the invention, currently only a simple interrupt model is used but the invention is not limited hereto. The interrupt handler consists of a task that repeatedly suspends itself and executes a piece of code when resumed. Execution of the code can be modeled as a delay call or can be generalized to arbitrary code. Generation of an interrupt corresponds to a resume call on the interrupt handler task. The task runs under a priority-based scheduler and thus can be assigned a priority. While the interrupt handler is running, new requests for the same interrupt handler are ignored. Requests for higher priority interrupts are immediately served, and requests for other, equal or lower priority interrupts are queued (at most one queued event per handler).

More complex models are of course possible. For example, if the interrupt handler task does not run the handler code itself, but spawns a new task for that purpose, the original handler task can immediately suspend again, thus re-enabling the interrupt while the handler is running. Interrupts could also be queued, and multiple interrupts can be multiplexed on one handler. This amount of detail was not necessary for the example application.

To validate the invented approach, a conceptual model of some example software and applied the three scheduler models, described above to it.

The example is a satellite receiver implemented as an ASIC with an embedded ARM processor. Four tasks are implemented in software (FIG. 13). The PLL, DLL and AGC tasks close the three feedback loops, and the CTL task (not shown on the figure) periodically checks for and processes user input. All four tasks are periodic, and have a deadline equal to their period. They do not directly interact with each other. A scheduling solution using only the FIQ and IRQ interrupts of the ARM processor based on theoretical considerations exists. Measured execution times of the first three on the ARM processor are also available; for the execution time of the CTL task, an arbitrarily fixed upper limit is set (FIG. 14).

The example software consists of four periodic tasks that do not interact with each other. As here only the scheduling of these tasks is of interest, the functionality is abstracted away and replaced by a simple delay call to model the execution time. Period and deadline are however essential and have been included in the model. A function is implemented that periodically sets a timer to expire at the next deadline, executes a delay call to model task execution, and checks that the timer did not expire. Each example software task is modeled by spawning this function with the appropriate period and execution_time arguments.

```
static const Time frequency = 40e6; // max ARM clock frequency
static const Time cycle = 1./frequency;
int main( )
{
    spawn(periodic, 15.6e-6, 234*cycle,"PLL");
    spawn(periodic, 500e-6, 500*cycle,"DLL");
    spawn(periodic, 15.6e-6, 107*cycle,"AGC");
    spawn(periodic, 0.1, 0.01, "CTL");
    run(0.3);
}
```

The conceptual model of the software is described above. The model is very concise due to reuse of the periodic function.

```
void periodic( Time period, Time execution_time )
{
    Time next = 0;
    for (;;) {
    next += period;
    Timer timer(next-now( ));
    delay(execution_time);
    if (timer.expired( )) {
        cout <<< " " <name( )
            << " missed deadline at " <<< endl;
        pauze( );
    }
    suspend( ); // timer will resume
    }
}
```

A periodic function modeling a periodic task with deadline checking is described above. To allow reuse, the function is parameterized with respect to the period and the execution time. The body of the task is modeled as a simple delay call; more complex behavior can be supported—and the reuse potential can be increased—by using a class instead of a function, and using a pure virtual function to define the body of the task.

```
class Timer: public Task {
    Task* _task;
    Time _timeout;
    Action lwbody( ) {
        if (_timeout 0) {
            delay(_timeout);
            _timeout = 0;
            return SYNC;
        } else {
            _timeout = -1.0;
            _task-resume( );
```

```
            return SUSPEND;
        }
    }
public:
    Timer( Time timeout ): _task(self( )), _timeout(timeout) { }
    bool expired( ) const { sync( ); return _timeout < 0; }
};
```

The Timer class has been implemented for use in the implementation of the periodic function, but is reusable and has been reused during refinement of the example model. The Timer class is also a good example of the implementation of a light-weight task.

One goal of the invention is to facilitate software related exploration by supporting the introduction of a scheduler in a conceptual model with minimal code changes. As a first experiment, a time-sliced round-robin scheduling is introduced in the conceptual example model. Compared to the original model, a processor/scheduler declaration, assigned the tasks to that processor are added. Also output statements to extract some scheduling statistics are introduced. The task code itself is unchanged.

```
static const Time frequency = 40e6; // max ARM clock frequency
static const Time cycle = 1./frequency;
int main( )
{
    Processor arm;
    arm.scheduler( )-slice(1e-6);
    arm.scheduler( )-overhead(0.1e-6);
    arm.spawn(periodic, 15.6e-6, 234*cycle,"PLL");
    arm.spawn(periodic, 500e-6, 500*cycle,"DLL");
    arm.spawn(periodic, 15.6e-6, 107*cycle,"AGC");
    arm.spawn(periodic, 0.1, 0.01, "CTL");
    run(0.3);
    cout.precision(3);
    cout <idleFraction( )*100 << "% idle" << endl;
    cout <overheadFraction( )*100 << "% overhead" << endl;
    cout <numberOfContextSwitches( ) << "context switches";
    cout <<< endl;
    cout << "TIPSY context switches: " <<< endl;
    cout << "bye" << endl;
}
```

The conceptual model of the example software, modified to use time-sliced round-robin scheduling is shown above. The original task code is unchanged.

When executed, this model produces an error message:

2.176e-05 PLL missed deadline at 1.56e-05

Experiments are performed with different time slices and even reduced the context switching overhead to zero, but a deadline error always resulted. In other words, round-robin scheduling does not work for this design. This result can also be derived theoretically, but it is comforting to see that theory and simulation agree.

To further facilitate exploration, it would be nice to have a (textual or graphical) user interface in which parameters such as the size of the time slices and overhead time can easily be changed. The scheduler model should include a link to the user interface to automatically display its scheduling statistics when included in the system model.

Scheduling theory predicts that a priority-based scheduler with meet deadline requirements if higher priorities are assigned to tasks with smaller periods. To verify this, the example model is changed to use a priority-based scheduler.

```
static const Time frequency = 40e6; // max ARM clock frequency
static const Time cycle = 1./frequency;
int main( )
{
    Processor arm;
    arm.scheduler( )-overhead(0.1e-6);
    arm.spawn(periodic, 15.6e-6, 234*cycle,"PLL")-priority(2);
    arm.spawn(periodic, 500e-6, 500*cycle,"DLL")-priority(1);
    arm.spawn(periodic, 15.6e-6, 107*cycle,"AGC")-priority(2);
    arm.spawn(periodic, 0.1, 0.01, "CTL")-priority(0);
    run(0.3);
    cout.precision(3);
    cout <idleFraction( )*100 << "% idle" << endl;
    cout <overheadFraction( )*100 << "% overhead" << endl;
    cout <numberOfContextSwitches( ) << "context switches";
    cout <<< endl;
    cout << "TIPSY context switches: " <<< endl;
    cout << "bye" << endl;
}
```

The conceptual model of the example software, modified to use priority-based scheduling, is shown above. The differences with the round-robin scheduling model are minimal: in the processor declaration, a PriorityScheduler is instantiated instead of a RoundRobinScheduler, and the priority parameter is set for each task. The original task code is still unchanged.

As expected, no deadlines are violated. Execution of the model generates the following output:

32.9% idle 1.5% overhead 44237 context switches

TIPSY context switches: 39669

Note that the number of context switches in the TIPSY simulation (39669) is smaller than the number of context switches in the modeled system (44237). As the ARM processor is idle for over 30% of the time, reduce its clock frequency (to reduce power consumption) is aimed at. With the proposed approach it is possible to reduce it to about 25.4 MHz without violating any deadlines.

The example software can be scheduled correctly using only the ARM interrupts, without introducing an RTOS. Indeed, the two interrupt levels of the ARM, together with the background (non-interrupt) processing, provide a hardware implementation of a three-level priority-based preemptive scheduler. The only additional hardware needed is a multiplexing mechanism to map the two tasks with the same priority (PLL and AGC) to the same interrupt level (IRQ); a software dispatcher demultiplexes them.

In the example model, interrupts can be introduced in two steps:

1) Introduction of hardware tasks and the communication between hardware tasks and software tasks;
2) Modeling of the multiplexing of the communication on the available interrupt levels.

Here, only the first step was shown for illustrative purpose.

The proposed hardware model consists of three tasks executing the periodic_request function; the rest of the hardware is not relevant for the illustration purposes here, but will of course be present in a more complete model of the example considered here. Also, the periodic tasks that are implemented as interrupts are no longer autonomous, so the periodic function used in previous versions of the model has been replaced by the interrupt_handler function. Communication between hardware and software is implemented using the suspend/resume functions of the invented kernel.

The resulting system model consists of three hardware tasks and four software tasks.

```
void periodic_request( Task*interrupt_handler, Time period )
{
    cout <<< " " <name( )
        << " period=deadline=" <<< endl;
    for ( ;;) {
        interrupt_handler-resume( );
        delay(period);
        if (!interrupt_handler-suspended( )) {
            cout <<< " " <name( )
                << " missed deadline" << endl;
            pauze( );
        }
    }
}
```

The periodic_request function, described above, periodically sends an interrupt request (modeled by a resume call) to an interrupt handler (modeled by a Task). A check is included that the handler has processed the request before sending a new request.

```
static const Time frequency = 25.4e6;
static const Time cycle = 1./frequency;
int main( )
{
Processor arm;
arm.scheduler( )-overhead(0.1e-6);
// Software tasks
Task* pll = arm.spawn(interrupt_handler,234*cycle,"PLL")-priority(2);
Task* dll = arm.spawn(interrupt_handler,500*cycle,"DLL")-priority(1);
Task* agc = arm.spawn(interrupt_handler,107*cycle,"AGC")-priority(2);
Task* ctl = arm.spawn(periodic,0.1, 0.01, "CTL")-priority(0);
// Hardware tasks
spawn(periodic_request,pll,15.6e-6,"PLL-hw");
spawn(periodic_request,dll,500e-6,"DLL-hw");
spawn(periodic_request,agc,15.6e-6,"AGC-hw");
run(0.3);
cout.precision(3);
cout <idleFraction( )*100 << "% idle" << endl;
cout <overheadFraction( )*100 << "% overhead" << endl;
cout <numberOfContextSwitches( ) << " context switches";
cout << "TIPSY context switches: " <<< endl;
cout << "bye" << endl;
}
```

The interrupt model of the example software, described above, includes hardware tasks that generate the interrupt requests.

When executing this model, it is expected that the same output as for the priority-based scheduler version, but actually, the following output is produced:

1.339e-06 PLL missed deadline

After some debugging, the problem is identified: at simulation time 0, the (software) PLL interrupt handler task suspends (to wait for an interrupt), and at the same time, the (hardware) PLL periodic request task sends a resume (or interrupt) request to the PLL interrupt handler. When two tasks are ready to execute at the same time, the order of execution is undefined; in this case, the scheduler choose to execute the hardware task first. At that point, the software task is not suspended yet, i.e. it is not yet waiting for an interrupt, so it ignored the interrupt request and therefore fails to meet the deadline. This problem looks like a pure modeling problem at first sight, but actually, it can also occur in the real system: it corresponds to the case where the first interrupt request is issued before the software is initialized.

The final system implementation needs to implement some kind of protection against this problem. It is a good thing that a simulation detects this kind of problem.

The detection of this bug with the model was to some extent accidental: if the scheduler had chosen another order of execution, the bug would not have been detected. To increase the chance of detecting such bugs, one could think of using random choices or other techniques in the scheduler.

The second step for the introduction of interrupts in the example model is the refinement of the communication between hardware and software. Ideally, the suspend/resume calls can simply be replaced by a multiplexing mechanism selected from a library.

In summary it can be stated that software scheduling effects are included in a executable system model and to use such a model for system exploration and refinement. Key issues are the modeling of preemption with the non-preemptive library, and the creation of scheduler models that can be introduced in a conceptual system model with minimal changes. Experiments with a simplified model of an example chip show that both issues are successfully resolved.

With the invention it is thus possible to efficiently model preemption while keeping the library non-preemptive by exploiting the fact that tasks always synchronize before communicating. The two new kernel functions, start and stop, do not preempt the task on which they are called, but accumulate a preemption-delay to be added to the task at the next synchronization point. By being part of the kernel, these two functions also allow the implementation of software scheduler models that can schedule tasks without changing the task code.

For software-related exploration and refinement, it is assumed that a conceptual executable system model is available, and that the assignment of tasks to software processors and the scheduling of these tasks is driven by timing constraints. The kind of exploration proposed is not possible without executable model, and possible but more difficult with a very detailed model. Software scheduling influences mainly the timing of the tasks, so modeling it only matters when timing constraints are important. Task code must model execution time using delay calls, but the estimation of execution times (ignoring preemption) is not part of the presented invention.

The invented modeling approach is especially useful for debugging and to verify the software scheduling decisions that were taken based on theoretical considerations or back-of-the-envelope calculations. Simplified example model captures only the execution time of the software tasks and checks deadlines. Without changing the task code, one is able to explore the effect of using different schedulers for these tasks, and verify that the theoretically derived scheduler meets all deadlines. The model is refined to use the ARM processor's interrupts for scheduling, thus reflecting a design decision. While experimenting with interrupt modeling, a bug is found in the synchronization between the initialization of hardware and software. The simple, conceptual system model and the fact that the model is non-preemptive seriously facilitate debugging compared to a real prototype. An RTOS is not introduced in the example model, because the example software can be successfully scheduled using interrupts only. In general however, based on the combination of the experience with RTOS modeling experience, it is believed that an executable system model can be elaborated step by step to include a full-fledged RTOS model and the final production code. The code in such a model is compiled for and runs on a (UNIX) workstation. It is annotated with delay statements to model the estimated or measured execution time on the target processor. The RTOS model provides a virtual prototype of an embedded processor, and can be used together with a model of the hardware to refine the software tasks of the conceptual model and check and debug the system before it is built.

To fully exploit the possibilities of the invented approach, a library of C++ objects modeling schedulers, RTOS models, timers, timing constraints, hardware peripherals, . . . is needed. Some of these objects are generic, and a few have already been created during experiments, but many will be specific for the hardware-software platform and design style used by the targeted design group. A useful feature to support the checking and debugging of real-time embedded software on a virtual prototype would be a link from these library objects to a (graphical) user interface (FIG. 15). Finally, techniques that increase the chance of detection of scheduling problems such as synchronisations bug, can easily be integrated in the invention.

To enable software modeling in the proposed model for generating an implementation of an essentially digital system, said method must be adapted to be able to cope with pre-emption of threads or tasks, meaning the fact that execution of a thread can be stopped due to an event external to said thread.

It is an aspect of the invented method to provide an efficient system modeling approach by reducing the number of context switches while simulating the representations of said essentially digital system, even when thread pre-emption is foreseen in said representation, for instance when software modeling is incorporated. The invented method is more efficient when compared to a traditional event-driven model.

In an embodiment of the invention method said context switch avoidance, also in the case of thread pre-emption, is done by providing some extra bookkeeping means.

Recall that in the invented method and design environment a number of so-called primitives, that can be used to model a system, are defined. Said primitives are also denoted functions for operating on said threads. Said primitives enable modeling of task-level concurrency and timing aspects, at a high level of abstraction and incrementally refine it to a register-transfer level description for hardware parts and production code for software parts. The model or representation of the system is efficient in the sense that it can be executed with fewer context switches than a traditional model with timing information, in which all operations in threads are executed in time order. The invention can be characterized in that the execution of the operations in threads is not directly based on the timing information. Instead the execution of said operations in said threads is such that functionally the execution of said operations in said threads is performed correct, meaning that the same result is obtained as if all operations in threads are executed in time order. In particular the execution of said operations in said threads in performed such that inter-thread communication is performed correct. It is this approach of focussing on inter-thread communication instead of time order, which prevents unnecessary context switching. When executing a system model with the invented method within the invented design environment, a context switch only occurs when a task or thread communicates with other tasks or thread (by accessing a shared variable). As long as it doesn't communicate, it can execute any number of operations including delay operations without context switch, even if this results in out-of-order execution. Out-of-order execution occurs when an operation A executes before operation B in simulated time, but after B in real time).

It is an aspect of the invention that the above described property is maintained in the invented method and the invented design environment for modelling thread pre-emption. Even when a task or thread is pre-empted (by calling stop and start from another task), a context switch will only occur when it communicates. Thus while simulating said executable representation of said essentially digital system, potentially with software modeling included, simulation of the operations in a pre-empted thread does not stop when the thread is pre-empted but when communication in said invoked by said pre-empted thread. Thus although one models that said thread stops, the simulation of said thread is not stopped. Nevertheless the invented method is adapted such that the overall simulation results are still the same as if the thread was actually pre-empted also in the simulation. Such approach again results in a reduction of the number of context switches.

The primitives described below show possible implementations of the invented method and design environment. Said implementations show also that such implementation only need some extra bookkeeping means, and are as such also efficient implementations. The primitives as described here correspond to an implementation with a global scheduler and global synchronization, but the invention is not limited hereto. With globality is meant that the sync() primitive synchronizes the calling task with all other tasks in the model, and does not exploit locality of communication. Below a list of primitives (functions on threads or tasks), according to a particular embodiment of the invented method and design environment, is listed, with a short summary of their main functionality.

- task spawn(soft):create a new task
- void kill(task): destroy an existing task
- void sync(): synchronize; required before shared data access
- void suspend(): suspend self, do nothing until resumed
- void resume(task): resume specified task
- void stop(task): stop specified task
- void start(task): start specified task
- void delay(period): consume specified amount of time in self
- Time now(): local time of self
- bool stopped(task): true for stopped task
- bool suspended(task): true for suspended task The start(), stop() and stopped() primitives are particularly incorporated for pre-emption support, enabling software modeling. The spawn() primitive now has an Boolean argument called 'soft'. The pre-emption support primitives have the following semantics according to this embodiment of the invention. Stopped(task) returns a flag indicating the current pre-emption state of a task: 'true' means that the task is stopped (=pre-empted), 'false' means that it is not stopped (='started'). The initial pre-emption state of a new task is 'started'. This flag can be considered as a bookkeeping means as described earlier. Stop(task) changes the pre-emption state of the task to 'stopped'. It has no effect when the task was already stopped. This operation is only allowed on a soft task, i.e. a task that was spawned with the 'soft' flag set to true. Said soft flag can also be considered as part of the bookkeeping means. Start(task) changes the pre-emption state of the task to 'started'. It has no effect when the task was already started. This operation is only allowed on a soft task, i.e. a task that was spawned with the 'soft' flag set to true. Note that said soft flag enables the system designer to intervene directly in the system representation, meaning indicating which tasks or threads can be pre-empted and which not. For instance threads which are meant to be realized physically by hardware, must be considered not pre-emptable. In the invented method at least one of said threads thus has a flag for indicating whether said stop and start function can be applied to said thread or not. In the invented method the set of functions contains a stop function for providing the method step of pre-empting a thread at any time by another thread and a starting function for providing the method step of starting a pre-empted or resumed threads by another thread.

During each execution of a sync(), suspend() or now() operation, the local time of a soft task is incremented by the amount of time during which the task was stopped after the previous execution of a sync(), suspend() or now() operation, and before the incremented local time. As a consequence, a stopped task cannot return from a sync(), suspend() or now() operation until it is started again.

Some possible implementations in pseudo C-like code of the invented method and design environment is described below with the following implementational notation:

'Self' represents the task executing the operation.

x,y' represents the attribute 'y' of task 'x'.

'Assert(x)' generates an error if the bool expression x is false.

'Synchronize' represents the appropriate synchronization actions for the chosen scheduler. For example, for a global non-pre-emptive sequential scheduler, 'synchronize' means 'switch to a non-suspended non-stopped task with lowest local time'.

In the implementations described below, each task has the following attributes:

- Time time; local time of task
- const bool soft; true for soft task, does not change after task creation
- bool stopped; true for stopped task
- bool suspended; true for suspended task These attributes are part of the implementation and cannot be accessed directly by task operations other than the primitives foreseen. This makes sure that a model is independent of the actual implementation of the primitives.

An implementation, not exploiting the context switch reduction potential of the primitives, is given below as a point of reference for the description of more optimized implementations further on. Note that said reference implementation is already an object of the invention, and useful in the concurrently refinement design methodology which is supported by the invention. In this reference implementation, synchronization is requested after every change to the time attribute (in the delay() and suspend() primitives). The sync() primitive is a no-operation function. Since only one task can be synchronized (=allowed to access shared variables) at any one time, parallel execution is not possible. Note that said reference implementation already introduces the concept of local time at a high-level of abstraction in executable models, which is an object of the invention. Said reference implementation does not support out-of-order execution, so pre-emption can only be modelled by regularly checking in each soft task whether the task was pre-empted, and suspending it until restarted. For an accurate model in terms of timing, the execution of each soft task needs to be split into short chunks (e.g. instructions), and pre-emption needs to be checked after execution of each chunk. The time accuracy of the model is limited by the size of the chunks.

The pre-emption primitives (start(), stop()) promise a timing accuracy that is independent of the chunk size, and only depends on the accuracy of the timing estimates used in the delay() calls. These primitives cannot be accurately implemented in the reference approach. The accuracy of the reference implementation given below in inversely proportional to the size of the chunks into which soft tasks have been split.

The task splitting in chunks can be done either manually (e.g. by inserting a delay() call after every chunk) or automatically (e.g. by an interpreter that executes the code chunk by chunk). In either case, the checking for pre-emption and the context switch when pre-emption occurs represent a serious overhead. The other implementations described below eliminates both overheads. Note that in the reference implementation, the 'soft' flag is not used, so all tasks can be considered soft with no extra cost and the soft attribute can be removed from the implementation. The 'soft' flag will be used in other implementations.

Reference implementation

```
task spawn(soft)
    create task
    task.time = now( )
    task.soft = soft
    task.stopped = false
    task.suspended = false
    return task
void kill(task)
    destroy task
void sync( )
    // do nothing; tasks are always synchronized
void suspend( )
    self.suspended = true
    synchronize
void resume(task)
    if (task.suspended) {
        task.suspended = false
        task.time = self.time
    }
void stop(task)
    task.stopped = true
void start(task)
    if (task.stopped) {
        task.stopped = false
        if (self.time > task.time) {
            task.time = self.time
        }
    }
void delay(period)
    self.time = self.time + period
    synchronize
Time now( )
    return self.time
bool stopped(task)
    return task.stopped
bool suspended(task)
    return task.suspended
```

An accurate and efficient implementation of pre-emption is described below. In contrast to the previous reference implementation, this implementation accurately models pre-emption, without the checking and context switch overhead of cutting soft tasks into chunks. The key observation is that pre-emption causes an extra delay, and that this delay has no effect until the pre-empted task tries to communicate or read the value of the current time (now()). So, instead of immediately interrupting a pre-empted soft task, it is allowed to run until it synchronizes. During synchronization, other tasks will call start() and stop() primitives, and these will automatically add the pre-emption delay to the task's local time. Only primitives that are changed with respect to the reference implementation are given below. Note that the resume() implementation need to be modified to correctly account for the case when a suspended task is preempted. A first implementation alternative 1 with extra 'stop_time' attribute is given below. The stop function does not stop the simulation of a thread but modifies a flag indicating whether said thread is expected to be stopped in real world or not and further stores the time in another attribute of said threat at which said thread is expected to be stopped in real world. In the invented method the set of functions contains a stop function for providing the method step of taking into account pre-emption of a thread at any time by another thread. Said stopfunction modifies a flag indicating pre-emption or not of a thread. Said stopfunction stores the local time at which said thread was pre-empted. Said starting function for providing the method step of starting a pre-empted thread by another thread takes into account that said stopfunction only modifies said flag or attributes as described above, and therefore for calculating the local time of a to be started thread it exploits the time stored by said stopfunction. This can be formalized by stating that the invented he method has a set of functions containing a stop function for providing the method step of taking into account pre-emption of a thread at any time by another thread. Further said stop function stores the local timing value of the thread being pre-empted. Also the method has a set of functions containing a starting function for providing the method step of starting a pre-empted thread by another thread. Further said starting function exploits the local time stored by said stop function for determining the local time of the thread being started.

```
void stop(task)
    if (!task.stopped) {
        task.stopped = true
        task.stop_time = self.time
    }
void start(task)
    if (task.stopped) {
        task.stopped = false
        task.time = task.time + (self.time − task.stop_time)
    }
void resume(task)
    if (task.suspended) {
        task.suspended = false
        task.time = self.time
        if (task.stopped) {
            task.stop_time = self.time
        }
    }
```

A second implementation alternative 2 without extra attribute is equivalent but slightly more efficient implementation. In this implementation, the time attribute no longer represents the task's local time while the task is stopped. Indeed because the simulation continues although in the real world said task or thread is meant to be stopped or pre-empted, the local time in the simulation does in such cases not resemble directly the time as if the thread was operating in the real world. It can be said that the local time of a thread is at least partly resembling the time as could be observed if the digital system was implemented. The variable associated to the threads or tasks represents thus partly the local timing for that thread when the thread is executed on a processing engine. More in particular when said thread is executed on dedicated hardware for said thread, and thus a non-preemptable thread is involved, said variable still resembles said local timing. When said thread is executed on a pro cessing engine of a more general nature, and said thread thus models software, still a partly resemblance is found. Said second alternative is described below.

```
void stop(task)
    if(!task.stopped) {
        task.stopped = true
        task.time = task.time − self.time
    }
void start(task)
    if (task.stopped) {
        task.stopped = false
        task.time = task.time + self.time
    }
void resume(task)
    if (task.suspended) {
        task.suspended = false
        if(task.stopped) {
            task.time = 0
        } else {
            task.time = self.time
        }
    }
```

A first further optimization consists of not synchronizing after every delay operation, but only when needed, i.e. before every access to a shared variable. In this implementation, the delay() operation can be called any number of times without synchronizing. The number of context switches is only reduced for a model in which the delay() operation is sometimes called more than once between synchronizations. Note that the task attributes are also shared variables, so synchronization is needed before accessing them unless it can be proven that the order of accesses has no impact on the final result. In the previous implementations, this synchronization was not needed, since the executing task was always synchronized. In particular, the prioritive is here adapted as it calls the sync function. In the method said function providing the method step of returning the local timing value of a thread is being adapted to call said synchronization function before returning said local timing value.

```
task spawn(soft)
    // No synchronization needed here:
    // no other task can access the new task's attributes before it is
    // created, so the creating task is automatically synchronized with respect
    to these attributes.
    create task
    task.time now( )
    task.stopped = false
    task.suspended = false
    return task
void kill(task)
    synchronize
    destroy task
void sync( )
    synchronize
void suspend( )
    synchronize // before access to shared suspended attribute
    self.suspended = true
    synchronize // to switch to other task
```

```
void resume(task)
    synchronize
    if (task.suspended) {
        task.suspended = false
        if (task.stopped) {
            task.time = 0
        } else {
            task.time = self.time
        }
    }
void stop(task)
    synchronize
    if (!task.stopped) {
        task.stopped = true
        task.time = task.time − self.time
    }
void start(task)
    synchronize
    if (task.stopped) {
        task.stopped = false
        task.time = task.time + self.time
    }
void delay(period)
    // No synchronization needed here:
    // since the delay operation can only be called by the task itself,
    // it is automatically ordered with respect to suspend( ), resume( )
    and now( ) calls.
    // Ordering with respect to start( ) and stop( ) calls is not needed,
    // since start( ), stop( ) and delay( ) only add some value to
    // the time attribute, and addition is a commutative operation.
    self.time = self.time + period
Time now( )
    synchronize
    return self.time
bool stopped(task)
    synchronize
    return task.stopped
bool suspended(task)
    synchronize
    return task.suspended
```

A second optimization makes use of the fact that the time attribute is only shared for soft tasks; the time attribute of a hard task can only be accessed by the task itself, so it is a local variable and no synchronization is needed before accessing it. This implementation is the same as the previous implementation except for the primitives given below.

```
task spawn(soft)
    // No synchronization needed here:
    // no other task can access the new task's attributes before it is
    // created, so the creating task is automatically synchronized with respect
    to these attributes.
    create task
    task.time = now( )
    task.soft soft // soft attribute is now needed.
    task.stopped = false
    task.suspended = false
    return task
Time now( )
    // time attribute is only shared for soft tasks
    if (self.soft) {
        synchronize
    }
    return self.time
void stop(task)
    assert(soft) // Make sure that only soft tasks can be stopped
    synchronize
    if(!task.stopped) {
        task.stopped = true
        task.time = task.time − self.time
    }
```

A third further optimized implementation avoids the double synchronization in the suspend() implementation of the first optimized implementation 1, at the cost of a slightly more complex implementation of the suspended() primitive. Changes with respect to first optimized implementation are required for the following primitives:

```
void suspend( )
    // First synchronization removed
    self.suspended = true
    synchronize
bool suspended(task)
    synchronize
    if (!task.suspended) {
        return false
    } else if (task.stopped) {
        return task.time <= 0
    } else {
        return task.time <= self.time
    }
```

The combination of second and third optimized implementation is also possible. In summary it can be stated that a method and design environment, which promises efficient system modeling by reducing the number of context switches compared to a traditional event-driven model, is proposed. Specifically, pre-emption, useful for software modeling, can be accurately modelled without splitting the execution of the pre-empted task in small chunks or introducing extra context switches. The needed primitives can be efficiently implemented, using just a handful of attributes for each task and a few comparisons, additions, subtractions and tests for each primitive.

It will be apparent to the skilled person that alterations and amendments can be made to the present invention in an obvious manner, the spirit and the scope of the present invention only being limited by the attached claims.

What is claimed is:

1. A method comprising:

defining a set of first process threads in a description language, wherein the set defines a first representation of the specification of an essentially digital system, wherein each first process thread represents a process carried out by the digital system, and wherein the description language is an object-oriented programming language, the defining comprising:

(1) associating with each of the first process threads a variable whose value represents local timing for that thread, wherein the content of the variable is indicative of an amount of time that is required to perform the process that is represented by the thread in the digital system;

(2) concurrently creating second process threads being refinements of at least part of the first process threads and having more detail while remaining within the specification of the digital system, the second process threads defining a second representation of the digital system;

(3) assigning to each new second process thread a value for the local timing variable; and (4) repeating steps 2 and 3 to produce second process threads of greater detail defining further representations of the digital system until the granularity of the representation of the digital system provided by the refined process threads is finer than a predetermined threshold.

2. The method of claim 1, wherein each representation generated by any of steps 1 through 4 is executable on a processing engine.

3. The method of claim 2, wherein the threads are executed concurrently on the processing engine.

4. The method of claim 3, wherein execution of each thread on the processing engine is determined by the value of the local timing variable of that thread, such that the thread with the lowest value of the local timing variable is executed first.

5. The method of claim 1, wherein the description language includes a set of functions operating oil the process threads.

6. The method of claim 5, wherein the set of functions comprises a function that creates a thread and associates the thread with a local timing value.

7. The method of claim 5, wherein the set of functions comprises a function that returns the local timing value of a thread, a function that increments the local timing value of a thread, a function that eliminates a thread, a synchronising function that synchronises a thread with another thread, and a function that returns an identification of a thread.

8. The method of claim 7, wherein the synchronising function is used whenever two or more threads access shared data.

9. The method of claim 7, wherein the set of functions comprises a suspend function that suspends a thread for a specified amount of time when a representation of the digital system is executed on the processing engine and a resume function that enables a thread to resume another suspended thread.

10. The method of claim 9, wherein execution of a thread on the processing engine is paused when either the synchronisation function or the suspend function is carried out on the thread.

11. The method of claim 10, wherein the description language is extended with a program construct that enables mutually exclusive access to shared resources by using the suspend function and the resume function.

12. The method of claim 10, wherein the description language is extended with a program construct that enables a thread to wait until an event occurs in another thread by exploiting the suspend function and the resume function.

13. The method of claim 1, wherein process threads are objects.

14. The method of claim 7, wherein the local timing value of a pre-empted thread is adapted with a pre-emption delay.

15. The method of claim 7, wherein the set of functions comprises a stop function that preempts a thread at any time by another thread.

16. The method of claim 15, wherein the set of functions comprises a starting function that starts a preempted or resumed thread.

17. The method of claim 7, wherein said function that returns the local timing value of a thread is adapted to call said synchronisation function before returning said local timing value.

18. The method of claim 16, wherein at least one of the first process threads comprises a flag for indicating whether said stop and start function can be applied to said thread or not.

19. The method of claim 7, wherein the set of functions comprises a stop function that takes into account preemption of a thread at any time by another thread.

20. The method of claim 19, wherein said stop function stores the local timing value of the thread being pre-empted.

21. The method of claim 20, wherein the set of functions comprises a starting function that starts a preempted thread by another thread.

22. The method of claim 21, wherein said starting function exploits the local time stored by said stop function for determining the local time of the thread being started.

23. A design environment for generating an implementation of an essentially digital system, comprising:
- a first description of the digital system in a description language as a set of first process threads, each of the threads being associated with a variable, wherein the content of the variable is indicative of an amount of time that is required to perform the process that is represented by the thread in the digital system;
- means for concurrently generating second process threads from at least a part of the first process threads, the second threads having more detail while remaining within the specification of the digital system, the second process threads defining a second representation of the digital system; and
- means for associating a variable to each second process thread having a value representing the local time of that second thread.

24. The design environment as in claim 23, further comprising means for executing the first or second representation of the digital system, the executing means comprising:
- a scheduler for concurrently executing the threads, the scheduler selecting the next thread to be processed such that variables shared by different threads are accessed in order of increasing value for the local time variable of the threads.

25. The design environment as in claim 24, further comprising means for returning the local time of a thread, means for incrementing the value of the local time of a thread, means for synchronising a thread with another thread, means for suspending processing of a thread for a specified amount of time and means for enabling a suspended thread to resume being processed.

26. The design environment as in claim 24, further comprising means enabling mutually exclusive access to shared resources, means enabling a thread to wait until an event occurs in another thread, the access enabling means and thread waiting means being adapted to use the suspending means and the resume means.

27. A method of simulating an implementable representation of an essentially digital system, comprising:
- defining a set of process threads in a description language, the set defining a representation of the specification of the digital system, each process thread representing a process carried out by the digital system;
- associating with each of the process threads a local timing variable whose value represents local timing for that thread, wherein the content of the local timing variable is indicative of an amount of time that is required to perform the process that is represented by the thread in the digital system; and
- simulating said representation by concurrently executing said threads on a processing engine, wherein synchronising of threads is used whenever two or more threads access shared data.

28. The method of claim 27, wherein execution of each thread on the processing engine is determined by the value of the local timing variable of that thread, such that the thread with the lowest value of the local timing variable is executed first.

29. The method of claim 27, wherein execution of a preempted thread is stopped only when synchronising.

30. The method of claim 27, wherein the local timing value of a pre-empted thread being adapted with a pre-emption delay after synchronising.

31. A design environment for simulating an implementable description of an essentially digital system, comprising:
- means for describing the digital system in a description language as a set of process threads, each of the threads being associated with a variable whose value represents a local time of the thread, wherein the content of the variable is indicative of an amount of time that is required to perform the process that is represented by the thread in the digital system;
- means for associating a variable to each process thread having a value representing the local time of that thread;
- means for executing said description of the digital system, the executing means comprising:
- a scheduler for concurrently executing the threads, the scheduler selecting the next thread to be processed such that variables shared by different threads are accessed in order of increasing value for the local time variable of the threads.

32. The design environment of claim 31, wherein execution of pre-empted threads is stopped only when synchronising.

33. The design environment of claim 32, wherein the local time value of a pre-empted thread being adapted with the pre-emption delay after synchronising.

34. The method of claim 1, additionally comprising generating an implementation of an essentially digital system that performs the processes represented by the second process threads.

35. The method of claim 1, additionally comprising mapping functionality to an architecture and accounting for communication and concurrency considerations.

* * * * *

UNITED STATES PATENT AND TRADEMARK OFFICE
CERTIFICATE OF CORRECTION

| | |
|---|---|
| PATENT NO. | : 6,952,825 B1 |
| APPLICATION NO. | : 09/484117 |
| DATED | : October 4, 2005 |
| INVENTOR(S) | : Cockx et al. |

It is certified that error appears in the above-identified patent and that said Letters Patent is hereby corrected as shown below:

Page 2, Col. 2 (Other Publications), Line 6, after "Abstract" insert -- , -- therefor.

At Sheet 7 of 10 (Fig. 10), Line 9, delete "implmentation" and insert -- implementation --, therefor.

At Col. 3, Line 49, delete "B. V.,1994," and insert -- B.V., 1994, --, therefor.

At Col. 9, Line 50 (approx.), delete "temporily" and insert -- temporarily --, therefor.

At Col. 18, Line 39, delete "setjmp/longimp" and insert -- setjmp/longjmp --, therefor.

At Col. 21, Line 31, after "10)" insert -- . --.

At Col. 24, Line 41, delete "suspend notify" and insert -- suspend_notify --, therefor.

At Col. 24, Line 41, delete "resume notify" and insert-- resume_notify --, therefor.

At Col, 26, Line 34, delete "interrupt handler" and insert -- interrupt_handler --, therefor.

At Col. 34, Line 25 (approx.), delete "x,y" and insert -- x.y --, therefor.

At Col. 37, Line 57 (approx.), after "task.time" insert -- = --.

At Col. 38, Line 51 (approx.), after "task.soft" insert -- = --.

UNITED STATES PATENT AND TRADEMARK OFFICE
CERTIFICATE OF CORRECTION

| | | |
|---|---|---|
| PATENT NO. | : 6,952,825 B1 | |
| APPLICATION NO. | : 09/484117 | |
| DATED | : October 4, 2005 | |
| INVENTOR(S) | : Cockx et al. | |

It is certified that error appears in the above-identified patent and that said Letters Patent is hereby corrected as shown below:

At Col. 40, Line 7, in Claim 5, delete "oil" and insert -- on --, therefor

At Col. 41, Line 43, in Claim 27, after "set of" insert -- first --.

At Col. 41, Line 44, in Claim 27, after "defining a" insert -- first --.

At Col. 41, Line 45, in Claim 27, after "each" insert -- first --.

At Col. 41, Line 47, in Claim 27, after "of the" insert -- first --.

At Col. 42, Line 4, in Claim 27, delete "engine," and insert -- engine and creating second process threads being refinements of at least part of the first process threads and having more detail while remaining within the specification of the digital system, the second process threads defining a second representation of the digital system, --, therefor.

At Col. 42, Line 20, in Claim 31, after "set of" insert -- first --.

At Col. 42, Line 26, in Claim 31, after "each" insert -- first --.

UNITED STATES PATENT AND TRADEMARK OFFICE
CERTIFICATE OF CORRECTION

PATENT NO. : 6,952,825 B1
APPLICATION NO. : 09/484117
DATED : October 4, 2005
INVENTOR(S) : Cockx et al.

It is certified that error appears in the above-identified patent and that said Letters Patent is hereby corrected as shown below:

At Col. 42, Line 31, in Claim 31, delete "threads," and insert -- threads and creating second process threads being refinements of at least part of the first process threads and having more detail while remaining within the specification of the digital system, the second process threads defining a second representation of the digital system, --, therefor.

Signed and Sealed this

Sixth Day of November, 2007

JON W. DUDAS
*Director of the United States Patent and Trademark Office*